United States Patent
Yamano (12)

(10) Patent No.: US 6,288,647 B1
(45) Date of Patent: Sep. 11, 2001

(54) PHOTOELECTRIC SMOKE DETECTOR, AND SMOKE DETECTION SECTION ASSEMBLY

(75) Inventor: Naoto Yamano, Tokyo (JP)

(73) Assignee: Hochiki Corporation, Tokyo (JP)

( * ) Notice: Subject to any disclaimer, the term of this patent is extended or adjusted under 35 U.S.C. 154(b) by 0 days.

(21) Appl. No.: 09/699,420

(22) Filed: Oct. 31, 2000

(30) Foreign Application Priority Data

Nov. 1, 1999 (JP) .................................................. 11-310585

(51) Int. Cl.[7] .................................................. G08B 17/10
(52) U.S. Cl. .......................... 340/630; 340/628; 250/574
(58) Field of Search .................................... 340/628, 630; 253/573, 574

(56) References Cited

U.S. PATENT DOCUMENTS 4,851,819 * 7/1989 Kawai et al. ........................ 340/630
5,138,302 * 8/1992 Nagaoka et al. ..................... 340/630
5,170,150 * 12/1992 Austin et al. ........................ 340/630
5,719,557 * 2/1998 Rattman et al. ..................... 340/628

* cited by examiner

*Primary Examiner*—Edward Lefkowitz
(74) *Attorney, Agent, or Firm*—Sughrue, Mion, Zinn, Macpeak & Seas, PLLC

(57) ABSTRACT

A photoelectric smoke detector includes a smoke detecting section defining a smoke detecting space, a light emission section holder having a light-emission element disposed in the smoke detecting section, and a light receiving section holder having a light-receiving element disposed in the smoke detecting section. The light-receiving element receives light which has been emitted from the light-emission element and is scattered by smoke flowing in the smoke detecting space. A hybrid circuit board has an integrated circuit mounted thereon and is housed in the light receiving section holder. The integrated circuit including the light-receiving element and at least a received-light signal amplifying circuit. The hybrid circuit board is arranged so that the light-receiving surface of the light-receiving element is directed toward the smoke detecting space.

44 Claims, 23 Drawing Sheets

PRIOR ART

PHOTOELECTRIC SMOKE DETECTOR, AND SMOKE DETECTION SECTION ASSEMBLY

BACKGROUND OF THE INVENTION

1. Field of the Invention

The present invention relates to a photoelectric smoke detector whose light receiving section receives light which is originated from a light-emitted section and is scattered by smoke flowing into a smoke detection section, thereby detecting occurrence of fire, as well as to a smoke detection section assembly. More particularly, the present invention relates to a photoelectric smoke detector using a hybrid circuit board, which board has mounted thereon an integrated circuit component including a light-receiving element and an amplifier circuit, in conjunction with other circuit components, as well as to a smoke detection section assembly.

2. Description of the Related Art

FIGS. 24 through 27 show a commonly-employed photoelectric smoke detector, wherein FIG. 24 is a longitudinal cross-sectional view of the smoke detector; FIG. 25 is a transverse cross-sectional view of the smoke detector; FIG. 26 is a layout and construction drawing of a smoke detecting section; and FIG. 27 is a disassembly view of the smoke detector.

As shown in FIGS. 24 and 25, a terminal board 203 is housed in an exterior cover 201, and a shield case 204 is fixedly attached to the interior of the terminal board 203. A smoke detection section main unit 205 is fitted to the terminal board 203, and a printed board 208 is provided on the smoke detection section main unit 205. A plurality of smoke inlets 202 are formed along the circumference of the exterior cover 201.

A smoke detection section cover 211 is removably attached to the lower surface of the smoke detection section main unit 205. Smoke inlets 215 are formed in the circumferential wall of the smoke detection section cover 211. A plurality of labyrinthine members 213 are formed inside the circumferential wall. An insect screen 214 is provided integrally on the smoke-detecting section 211.

A light-emission element 221, such as an infrared LED or the like, is housed in a light-emission holder 217 provided on the lower surface of the smoke detection section main unit 205. A light-receiving holder 216 houses a light-receiving element 220, such as a photodiode PD or the like. As can be seen from FIG. 26, the optical axis of the light-emission element 221 and the optical axis of the light-receiving element 220 are arranged so as to cross each other in the center of a smoke detecting space and at an angle of, for example, 70°. Here, reference numeral 228 designates an infrared LED for test purpose, and 232 designates a plate member having a slit formed therein.

As shown in FIG. 27, the above-described smoke detector is built by means of assembling together the terminal board 203 having fitting metal fitting 209 fixed thereon; the shield case 204; packing 207, the printed board 208; the smoke detection section main unit 205; the smoke detection section cover 211; and the exterior cover 201.

In such a commonly employed photoelectric smoke detector, the light-receiving element 220 is housed in the light-receiving holder 216 and is connected to the printed board 208 disposed on the smoke detection section main unit 205 by means of lead wires. When flowing through lead wires, a faint light-receiving signal is prone to external noise. In order to protect the light-receiving signal from external noise, a metal shield cap 227 is provided within the light-receiving holder 216.

Electric circuit components to be mounted on the printed board 208 are made compact by means of being made in the form of chip components. Further, the number of components is reduced by means of optimization of circuit design. However, there are limitations to further miniaturization of an electric circuit and to a further reduction in the number of electric circuit components.

SUMMARY OF THE INVENTION

It is an object of the present invention to provide a photoelectric smoke detector which prevents intrusion of noise by way of lead wires of a light-receiving element and enables a significant reduction in the number of components, as well as a smoke detection section assembly.

It is another object of the present invention to provide a photoelectric smoke detector which enables a significant reduction in the number of assembly steps, as well as a smoke detection section assembly.

To this end, the present invention is embodied by providing the following configurations.

The present invention provides a photoelectric smoke detector including: a smoke detecting section defining a smoke detecting space; a light emission section holder having a light-emission element disposed in the smoke detecting section; and a light receiving section holder having a light-receiving element disposed in the smoke detecting section, wherein the light-receiving element receives light which has been emanated from the light-emission element and is scattered by smoke flowing in the smoke detecting space, thereby detecting occurrence of fire.

In the photoelectric smoke detector according to the present invention, a hybrid circuit boardwhich has an integrated circuit mounted thereon and is housed in the light receiving section holder, the integrated circuit including the light-emission element and at least a received-light signal amplifying circuit, and that the hybrid circuit board is arranged such that the light-receiving surface of the light-receiving element is directed toward the smoke detecting space.

The majority of electric components constituting electrical circuits of a photoelectric smoke detector are mounted on a hybrid circuit board housed in a light-receiving holder. Further, an amplifying circuit and a light-receiving element are integrated into a single piece, and hence substantially no lead wires are present between the light-receiving element and the amplifying circuit, thus preventing thorough influence of extraneous noise.

The light-receiving element and an amplifying circuit thereof are integrated into a single piece, and remaining electric circuit components are mounted on a circuit board as discrete components, thus constituting a hybrid structure. As a result, the number of components is greatly diminished, thereby resulting in a great reduction in the number of assembling steps.

Since the hybrid circuit board is housed within a light receiving section holder situated within a smoke detecting space, a space for housing a circuit board to be provided at an elevated position within the smoke detecting section becomes unnecessary, and the smoke detector can be greatly miniaturized correspondingly.

The majority of electric circuit components of the detector including the integrated circuit are mounted on one surface of the hybrid circuit board. An opening is formed in an area on the hybrid circuit board on which the integrated circuit is to be mounted. The integrated circuit is mounted on the hybrid circuit board such that the light-receiving surface of the light-receiving element is directed toward the remaining surface of the hybrid circuit board by way of the opening.

The surface of the hybrid circuit board opposing the smoke detecting space serves as a surface to be used specifically for mounting a light-receiving element. The other surface of the hybrid circuit board serves as a surface to be used specifically for mounting electric circuit components. As a result, a single circuit board can be used for receiving light as well as for mounting circuit components without involvement of influence, which would otherwise be exerted on each other.

By means of the structure of the hybrid circuit board, only the surface on which electric circuit components are to be mounted is coated without exerting an influence on the surface having the light-receiving element mounted thereon. Therefore, corrosion-resistance of the hybrid circuit board can be improved.

Preferably, a package of the integrated circuit is molded integrally with a condenser lens. Alternatively, a separate condenser lens is attached to a package of the integrated circuit.

Preferably, a pair of pieces of first lead metal fitting are connected at one end thereof to leads of the hybrid circuit board and are connected at the other end thereof to leads of the light-emission element, thus supporting the light-emission element, and a pair of pieces of second lead metal fitting to be used for establishing electrical connection with the outside are connected to remaining leads of the hybrid circuit board.

According to the structure of the smoke detector, connection among the light-emission element, the light-receiving element, the hybrid circuit board, and the outside of the smoke detector is integrated when pieces of lead metal fitting are connected to corresponding leads (by means of soldering or caulking). As a result, the light-emission element, the light-receiving element, and the hybrid circuit board can be disposed in a smoke detecting section without use of screws. Assembly of the smoke detector is facilitated, thereby curtailing costs. Further, leads of a light-emission element may be formed and connected directly to leads of the hybrid circuit board.

Preferably, the photoelectric smoke detector further comprises a light-emission circuit board which is separated from the hybrid circuit board and has mounted thereon electric circuit components constituting the light-emission element and a light-emission drive circuit and through which a comparatively large current flows. Preferably, a plurality of pieces of first lead metal fitting are connected at one end thereof to leads of the hybrid circuit board and are connected at the other end thereof to leads of the light-emission circuit board, and a pair of pieces of second lead metal fitting to be used for establishing electrical connection with the outside are connected to remaining leads of the hybrid circuit board.

As mentioned above, since the light-emission element through which a comparatively large current flows is mounted on another circuit board while being separated from a drive circuit, thereby spacing the light-emission element apart from the amplifying circuit. Consequently, there can be prevented occurrence of an adverse effect on the light-receiving element, which would otherwise be caused by a comparatively large pulse current which flows for driving the light-emission element.

Preferably, a current limit resistor is provided in the light-emission drive circuit, and the light-receiving sensitivity is adjusted by means of selecting the value of the current limit resistor. More preferably, intermediate portions of the leads of the light-emission element connected to the light-emission circuit board are bent into a loop shape, and an offset of the optical axis, which would be caused at the time of manufacture or assembly of a light-emission element, is adjusted by means of mechanical bending of the leads.

Preferably, a faceplate seal is affixed to the reverse side of the smoke detecting section in which the second lead metal fitting is disposed in an exposed state. As a result, the photoelectric smoke detector obviates a necessity of a special cover or closure and can be embodied in a simple structure.

Preferably, the light-emission element is additionally mounted on the hybrid circuit board, and the hybrid circuit board has a light guide for guiding the light emitted from the light-emission element to the smoke detecting space.

In the smoke detecting section of the photoelectric smoke detector according to the present invention, a wall element constituting a labyrinthine structure is provided upright on the smoke detection section main unit so as to become open toward the bottom side of the smoke detecting section. Since the bottom of the smoke detecting section is opened, the efficiency of inflow of smoke is improved. Particularly, smoke flows into the light emission section holder and the light receiving section holder after having passed through the open bottom and the smoke detecting space. Therefore, directional control of inflow smoke can be improved, thereby facilitating cleaning of the smoke detecting section which involves removal of the exterior cover.

Preferably, an insect screen is made of permeable raw material woven of fibers, and the insect screen is fixedly positioned so as to cover the surroundings and bottom of the smoke detecting section at the time of assembly of the smoke detector. For instance, the insect screen is fixedly sandwiched between the peripheral edge of the smoke detection section main unit and the interior of an exterior cover. Thus, handling of an insect screen during an assembling operation becomes very easy, and removal of the insect screen which would be required in the future can be facilitated and made less costly.

The integrated circuit used for the photoelectric smoke detector may be formed from only a light-receiving element and an amplifying circuit. However, in addition, the integrated circuit may have a smoke detecting circuit and a light-emission oscillator circuit mounted thereon. Alternatively, in addition to the light-receiving element and the amplifying circuit, the integrated circuit may have mounted thereon a smoke detecting circuit, a light-emission oscillator circuit, a fire signal output circuit, and a power circuit. Alternatively, a first integrated circuit into which the light-emission element and the amplifier circuit are integrated and a second integrated circuit into which remaining circuits are integrated may be mounted on the hybrid circuit board.

The photoelectric smoke detector according to the present invention is formed from five parts; that is, the exterior cover, the insect screen, a smoke detection section main unit, a smoke detection section assembly having the hybrid circuit board, and the faceplate seal. As a result, the number of components required of the photoelectric smoke detector according to the present invention is greatly diminished when compared with those required of a commonly-employed smoke detector, thereby attaining facilitated assembly and cost cuttings.

Preferably, the photoelectric smoke detector according to the present invention further comprises a low-profile mount base which is situated inside the exterior cover when fitted to the smoke detector, so that the mount base hides from the outside. The low-profile mount base used in mounting a smoke detector on the ceiling hides from the smoke detector. Therefore, a mount base which has poor appearance and is formed from sheet metal can employed without involvement of a problem, thereby rendering a mount base thin and enabling cost cutting. The low-profile mount base is a thin disk-shaped or polygonal member, and fitting sections are formed along the periphery of the mount base.

The present invention also provides a smoke detection section assembly including: a light emission section holder having a light-emission element, and a light receiving section holder having a light-receiving element, wherein the light-receiving element receives light which has been emanated from the light-emission element and is scattered by smoke flowing in the smoke detecting space, thereby detecting occurrence of fire.

In the smoke detection section assembly according to the present invention, the smoke detection section assembly comprises a hybrid circuit board which has an integrated circuit mounted thereon and is housed in the light receiving section holder, the integrated circuit including the light-emission element and at least a received-light signal amplifying circuit, wherein the hybrid circuit board is arranged such that the light-receiving surface of the light-receiving element is directed toward the smoke detecting space. In more detail, the smoke detection section assembly is identical in structure with the portion of the smoke detector which is removably attached to the smoke detection section main unit.

The present invention provides a higher-performance and compact photoelectric smoke detector having, for example, an analog transmission function, a remote test function, or a stain compensation function.

In a case where there is constituted a high-performance photoelectric smoke detector, a function addition circuit board which is separated from the hybrid circuit board and has mounted thereon electric circuit components constituting a function addition circuit for attaining a high-performance detector is fixedly connected to the hybrid circuit board. The function addition circuit board is housed in a circuit housing section defined in a position above the smoke detecting space.

Preferably, the smoke detector further comprises a light-emission circuit board which is separated from the hybrid circuit board and has mounted thereon electric circuit components constituting the light-emission element and a light-emission drive circuit and through which a comparatively large current flows. Desirably, the light-emission circuit board and the hybrid circuit board are fixedly connected to the function addition circuit board. In association with this, a pair of pieces of lead metal fitting to be used for establishing electrical connection with the outside are connected to leads of the function addition circuit board.

In a case where there is constituted an analog detector additionally provided with an analog transmission function, at least a transmission circuit, an address setting circuit, a control circuit, and a test light-emission element are mounted on the function addition circuit board.

In a case where there is constituted a detector additionally provided with a remote test function, the function addition circuit board is equipped with a test circuit which performs a test operation upon detection of a test signal addressed to the test circuit and sends a test output signal.

In a case where there is constituted a detector additionally provided with a stained state display function, the function addition circuit board has mounted thereon at least a stain detection circuit which monitors whether or not a zero point level of an amplified received-light output falls within a predetermined sensitivity range and produces an output when the zero point level falls outside the predetermined sensitivity range, a stain alarm output circuit which outputs a stain alarm upon receipt of an output from the stain detection circuit, and an indication lamp circuit which, upon receipt of the stain alarm output, indicates that the zero point level of the amplified received-light output is outside the sensitivity range.

Preferably, the photoelectric smoke detector further comprises a current control circuit for controlling the amount of light emitted by the light-emission element, and the stain detection circuit increases or decreases the amount of emission light by means of controlling the current control circuit in accordance with a detected stained state, thereby compensating for a decrease or increase in the amount of light caused by stain.

Preferably, electric circuit components are mounted on the function addition circuit board so as to face the smoke detecting space. Further, in association with electric circuit components being mounted on the function addition circuit board, operations of unrequired circuit section mounted on the hybrid circuit board are inhibited.

BRIEF DESCRIPTION OF THE INVENTION

PREFERRED EMBODIMENTS OF THE INVENTION

Preferred embodiments of the present invention will be described as follows referring to the accompanying drawings.

Figure 1:
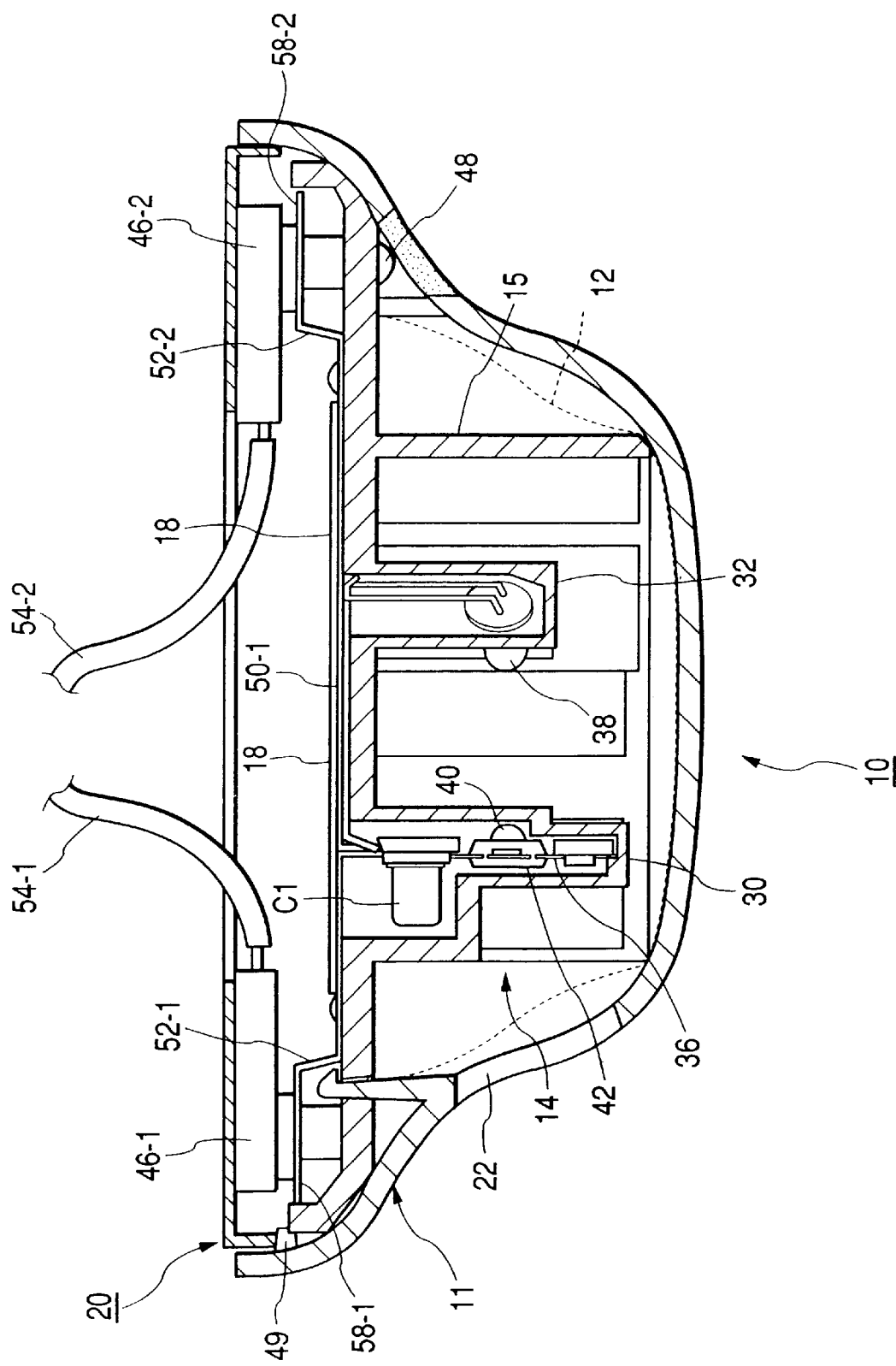
FIG. 1 is a cross-sectional view of a photoelectric smoke detector according to the present invention.

FIG. 1 is a cross-sectional view showing a photoelectric smoke detector according to the present invention when the smoke detector is attached to a ceiling.

As shown in FIG. 1, a photoelectric smoke detector 10 according to the present invention comprises an exterior cover 11 and a smoke detecting section 14. An insect screen 12 is provided inside the exterior cover 11 and is sandwiched between the exterior cover 11 and the smoke detecting section 14. A faceplate seal 18 is affixed on the upper surface of the smoke detecting section 14. The photoelectric smoke detector 10 is forcefully fitted around a mount base 20 fixedly screwed to the ceiling. Fitting projections 49 provided on the interior of the exterior cover 11 are fitted with fitting pieces provided on the mount base 20, where with the photoelectric smoke detector 10 is fixedly supported by the mount base 20.

A plurality of smoke inlet windows 22 are formed along the circumferential surface of the exterior cover 11 of the photoelectric smoke detector 10. The smoke detecting section 14 built into the inside of the exterior cover 11 constitutes a smoke detecting chamber underneath the bottom of a smoke detection section main unit 15 such that the smoke detecting chamber has an opening. A light receiving section holder 30 and a light emission section holder 32 are provided within the smoke detecting chamber.

A light-emission element 38 using an infrared LED is built in the light emission section holder 32. A hybrid circuit board 36 is built into the light receiving section holder 30. An integrated circuit 42 equipped integrally with a light receiving section 40 is mounted on the hybrid circuit board 36.

On the hybrid circuit board 36, there are mounted, as discrete chip components, a capacitor C1 for supplying an electric current required for causing the light-emission element 38 to emit pulse light, and electric circuit components which are not incorporated in the integrated circuit 42.

A pair of pieces of lead metal fitting 52-1 and 52-2 are provided on the reverse side of the smoke detection section main unit 15, and base contact sections 58-1 and 58-2 are formed along the outer circumferential edge of the smoke detecting section main unit 15. The base contact sections 58-1 and 58-2 come into electrical contact with corresponding terminal blocks 46-1 and 46-2 provided on the mount base 20.

Lead wires 54-1 and 54-2 are pulled out from the reverse side of the ceiling by way of a wire through hole formed in the center of the mount base 20, and the thus-pulled lead wires 54-1 and 54-2 are inserted into and connected to the corresponding terminal blocks 46-1 and 46-2.

Figure 2:
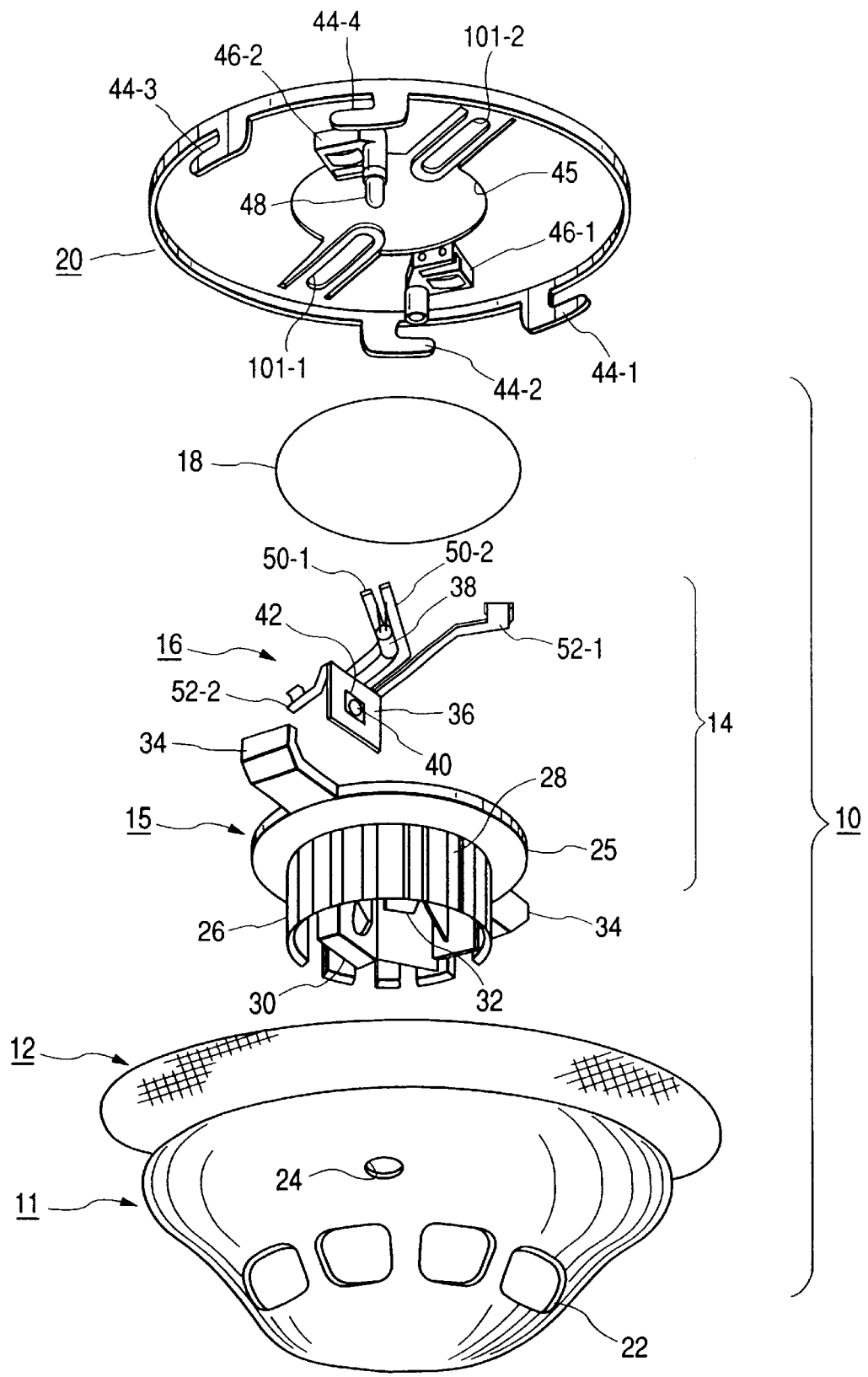
FIG. 2 is an exploded view of the smoke detector according to the present invention.

FIG. 2 shows an exploded view of the photoelectric smoke detector according to the present invention shown in FIG. 1, along with the mount base 20.

As shown in FIG. 2, the photoelectric smoke detector 10 according to the present invention comprises, in sequence from below, the exterior cover 11, the insect screen 12, the smoke detection section main unit 15, a smoke detection section assembly 16 provided with a hybrid circuit board 36, and the faceplate seal 18. As shown in FIG. 1, the photoelectric smoke detector 10 is fittingly secured to the mount base 20.

Smoke inlet windows 22 are formed in a lower portion of the outer periphery of the exterior cover 11. An indication hole 24 is formed in the exterior cover 11, and the tip end of a disaster warning indicating lamp 48 is provided on the mount base 20.

The indication hole 24 doubles as a drip hole for discharging any water leaking from the ceiling, to thereby prevent formation of a puddle of water within the smoke detector 10.

The insect screen 12 is continuously attached to the exterior cover 11. For instance, canvas made of meshed fabric is used as the insect screen 12. When the smoke detection section main unit 15 and the exterior cover 11 are assembled together, the insect screen 12 is sandwiched therebetween. As shown in FIG. 1, the insect screen 12 is sandwiched between the exterior cover 11 and the smoke detecting section main unit 15 so as to be situated between the smoke inlet holes 22 and an interior smoke detecting space.

The smoke detecting section 14 is made up of the smoke detection section main unit 15 and the smoke detection section assembly 16. The smoke detection section main unit 15 is made up of an upper disk-shaped base 25, and a peripheral wall 26 having openings 28 formed therein is provided on the underside of the base 25. A labyrinthine structure is formed within the peripheral wall 26. The light receiving section holder 30 and the light emission section holder 32 are provided within the interior smoke detecting space.

A pair of assembly arms 34 project from respective sides of the base 25. The smoke detection section main unit 15 is characterized in that the peripheral wall 26 has no bottom and is opened toward the exterior cover 11. Because of such a structure, in a case where smoke enters the smoke detector 10 by way of the smoke inlet windows 22 while the smoke detection section main unit 15 is assembled in the exterior cover 11 as shown in FIG. 1, the smoke flows into the interior smoke detecting space by way of the openings 28 formed in the peripheral wall 26. Simultaneously, smoke flows into the smoke detecting space by way of the open bottom of the peripheral wall 26. Thus, there can be attained considerably-superior smoke inflow efficiency and inflow directivity.

The smoke detection section assembly 16 comprises a pair of pieces of lead metal fitting (first lead metal fitting) 50-1 and 50-2 for connecting the light-emission element 38 to the hybrid circuit board 36, and a pair of pieces of lead metal fitting (second lead metal fitting) 52-1 and 52-2 to be brought into contact with the mount base 20.

An integrated circuit 42 is mounted on the hybrid circuit board 36, and a light-receiving element is provided integrally in the integrated circuit 42. To this end, the hybrid circuit board 36 is equipped with the light receiving section 40 having a lens. The smoke detection section assembly 16 is built into the smoke detecting section main unit 15 from above while remaining in an assembled state shown in the drawing. As a result, the integrated circuit 42 is situated in the center of the light receiving section holder 30. Moreover, the light-emission element 38 is situated within the light emission section holder 32, thus embodying a smoke detecting structure of scattered-light type.

The faceplate seal 18 is placed on the smoke detecting section 14 so as to block an open hole formed in the smoke detection section main unit 15 for accommodating the smoke detecting section 14, after the smoke detection section assembly 16 has been built into the smoke detection section main unit 15 from above.

The photoelectric smoke detector 10 according to the present invention can be completed by means of assembly of five parts; that is, the exterior cover 11, the insect screen 12, the smoke detection section main unit 15, the smoke detection section assembly 16 having the hybrid circuit board 36, and the faceplate seal 18.

In the case of the commonly-employed photoelectric smoke detector shown in FIG. 22, seven parts ranging from the exterior cover 201 to the terminal board 203, in sequence from below, are required. In the smoke detection section main unit 205, the light-receiving element 220 is housed in the light receiving section holder 216, and the light-emission element 221 is built into a light-emission holder 217. Thus, the commonly-employed photoelectric smoke detector involves assembly of a plurality of parts. In contrast with the commonly-employed photoelectric smoke detector, the smoke detector according to the present invention requires only a single smoke detection section assembly 16.

Consequently, in contrast with the commonly-employed smoke detector, the photoelectric smoke detector according to the present invention enables a considerable reduction in the number of parts to be assembled, facilitated assembly of parts, corresponding cost reduction, and miniaturization of the smoke detector.

The mount base 20, by way of which the photoelectric smoke detector according to the present invention is assembled from the five parts, is attached to the ceiling. Four fitting pieces 44-1, 44-2, 44-3, and 44-4 are formed at respective positions along the circumference of the mount base 20. A wire through hole 45 is formed in the center of the mount base 20, and mount screw through holes 101-1 and 101-2 are formed at respective positions and extend toward the wire through hole 45.

The fitting projections 49 provided inside the exterior cover 11 shown in FIG. 1 are fitted into corresponding fitting pieces 44-1 to 44-4 of the mount base 20, thus fixedly supporting the photoelectric sensor 10.

Since the mount base 20 has such a low-profile structure, the mount base 20 can be readily formed by means of punching sheet metal. Terminal blocks 46-1 and 46-2 are attached on the mount base 20 so as to face downward, and the disaster warning indicating lamp 48 is attached on the terminal block 46-2.

When the photoelectric smoke detector 10 shown in FIG. 1 is mounted on the ceiling, the mount base 20 is retracted into the exterior cover 11 and is prevented from becoming exposed. Therefore, there can be obviated a necessity of forming the mount base 20 from synthetic resin, as is the exterior cover 11 of the sensor 10, or a necessity of coating the mount base 20 for enhancing the appearance of the smoke detector 10, which is required of a commonly-employed photoelectric smoke detector. The only requirement is that the mount base 20 formed from sheet metal be imparted with corrosion resistance; namely, rust proofing. Therefore, costs of the mount base 20 are reduced correspondingly.

Since the mount base 20 is very thin, the degree of projection of the photoelectric smoke detector 10 when the sensor is mounted on the ceiling can be sufficiently reduced. A detector circuit is integrated, and the thus-integrated detector circuit is mounted on the hybrid circuit board 36. The hybrid circuit board 36 is housed in the light receiving section holder 30 of the smoke detection section main unit 15. As a result, the photoelectric smoke detector 10 obviates the necessity for a space for housing a circuit board which has hitherto been formed in a position above the smoke detecting section 14.

As mentioned above, a necessity for forming the circuit board housing section in a position above the smoke detecting section is obviated. Accordingly, the height of the smoke detector is considerably reduced, thus embodying a compact and low-profile sensor structure. Combined with the thin mount base 20, the compact and low-profile sensor structure enables a significant reduction in the degree to which the smoke detector 10 protrudes from the ceiling, as compared with the case of the commonly-employed smoke detector.

Figure 3:
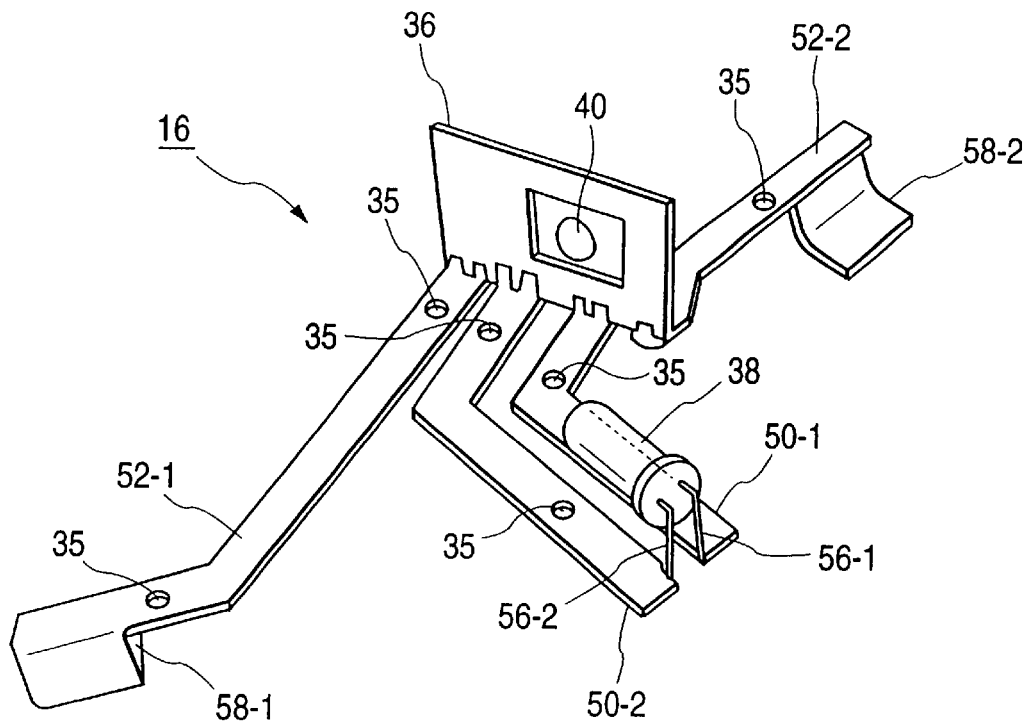
FIG. 3 is a descriptive view of a smoke detecting section shown in FIG. 2 when the smoke detecting section is taken out of the smoke detector and is viewed from a light receiving section.
Figure 4:
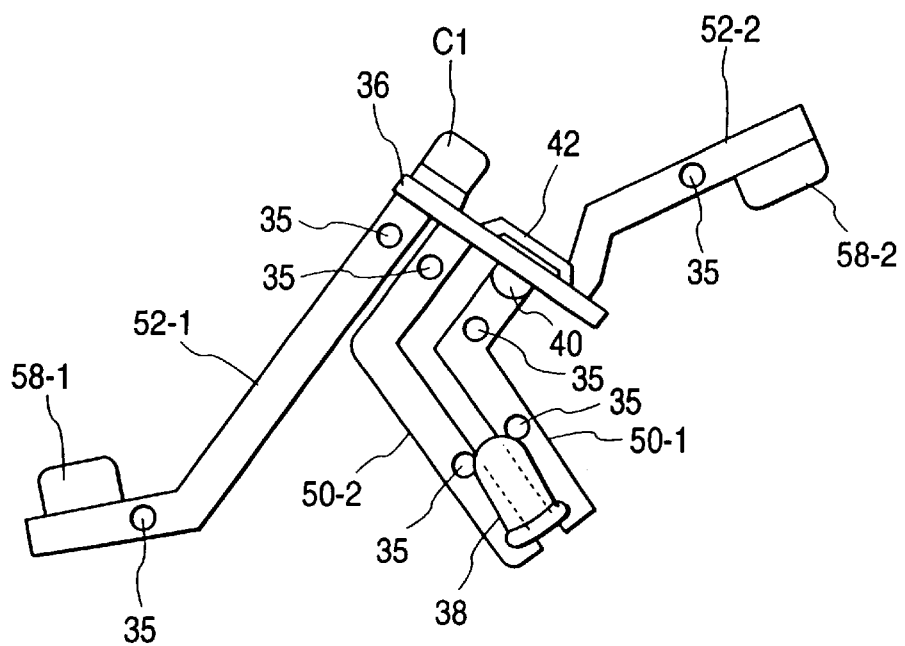
FIG. 4 is a plan view of the smoke detection section shown in FIG. 3.

FIG. 3 shows the smoke detection section assembly 16 shown in FIG. 2 when it is removed from the smoke detecting section 14. FIG. 4 is a plan view of the smoke detection section assembly 16. In the smoke detection section assembly 16, the pair of pieces of lead metal fitting (first lead metal fitting) 50-1 and 50-2 are fixed at one end to the edge of the hybrid circuit board 36. The light-emission element 38 is fixedly connected to the other ends of the pieces of lead metal fitting 50-1 and 50-2, by way of leads 56-1 and 56-2.

The light-emission element 38 is connected to and supported by the leads 56-1 and 56-2. As can be seen from a plan view shown in FIG. 4, the optical axis of the light-emission element 38 and the optical axis of the light-emission element incorporated in the integrated circuit 42 cross each other at a predetermined angle. Thus, the smoke detecting structure of scattered-light type is embodied. The leads 56-1 and 56-2 of the light-emission element 38 may be connected directly to the edge of the hybrid circuit board 36 in much the same way as the pieces of lead metal fitting 50-1 and 50-2, by means of forming and without use of the pieces of lead metal fitting 50-1 and 50-2.

A pair of pieces of lead metal fitting (second lead metal fitting) 52-1 and 52-2 are fixedly connected to the hybrid circuit board 36 such that one of the pieces of lead metal fitting is connected to one side of the circuit board 36 and the remaining piece of lead metal fitting is connected to the other side of the same. A rectangular base contact section 58-1 of bent structure is formed on the external end of the piece of lead metal fitting 52-1, and a rectangular base contact section 58-2 of bent structure is formed on the external end of the piece of lead metal fitting 52-2.

Further, one or a plurality of boss holes 35 are formed in each of the pieces of lead metal fitting 50-1, 50-2, 52-1, and 52-2. Bosses formed on the reverse side of the base 25 of the smoke detecting section main unit 15 shown in FIG. 2 are fitted into corresponding bosses, thus fixedly positioning the smoke detecting section main unit 15.

Figure 5A:
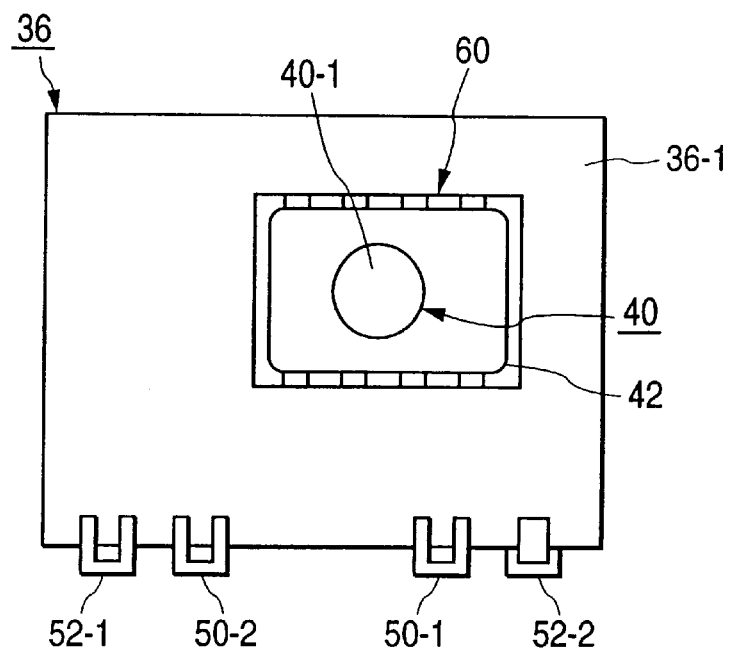
FIG. 5A is a descriptive view showing a light receiving section of the hybrid circuit board shown in FIG. 3.
Figure 5B:
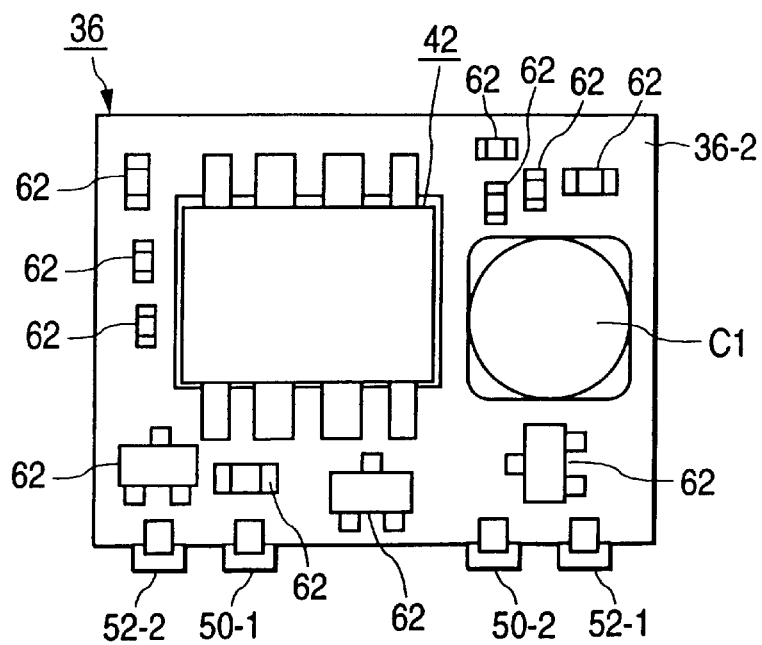
FIG. 5B is a descriptive view showing a circuit-component-mounted side of the hybrid circuit board shown in FIG. 3.

FIGS. 5A and 5B show the hybrid circuit board 36 shown in FIG. 3 when it is taken out from the smoke detection section assembly 16. FIG. 5A shows a light-receiving surface 36-1 positioned opposite the smoke detecting space, and an opening 60 is formed at a predetermined location on the hybrid circuit board 36. The light receiving section 40 is positioned in the opening 60.

FIG. 5B shows a part mount surface 36-2 which serves as the reverse side of the light-receiving surface 36-1. The integrated circuit 42 in which are packed a light-receiving element and the majority of detector circuits is mounted on the part mount surface 36-2 while being turned upside down. Electric circuit components which are not included in the integrated circuit 42 are mounted around the integrated circuit 42 as surface-mounted discrete chip components 62. The surface-mounted capacitor C1 for supplying an electric current for causing the light-emitting element to emit light is mounted as an independent component, since the capacitor C1 is an electrolytic capacitor of large capacitance.

Figure 6A:
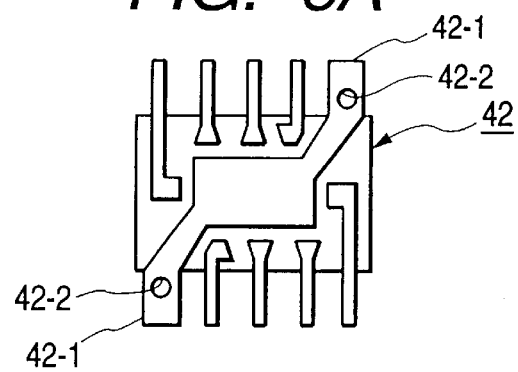
FIGS. 6A to 6C are cross-sectional views showing the hybrid circuit board shown in FIG. 5.

FIG. 6A shows the integrated circuit 42 when viewed from the underside thereof. A positioning hole 42-2 is formed in each of lead frames 42-1 located opposite in a diagonal direction of the integrated circuit 42. As shown in FIG. 5B, in a case where the lead frames 42-1 of the integrated circuit 42 are attached to component mount pads laid on the hybrid circuit board 36 by means of solder reflow, creamy solder is printed on the component mount pads. At this time, application of creamy solder to areas corresponding to the positioning holes 42-2 is avoided.

When the lead frames 42-1 of the integrated circuit 42 are subjected to solder reflow in this state, the positioning holes 42-2 are positioned in the areas on the component mount pads where no creamy solder is present, by means of surface tension of solder. As a result, the lens section 40-1 is positioned in the opening 60 shown in FIG. 5A.

Figure 6B:
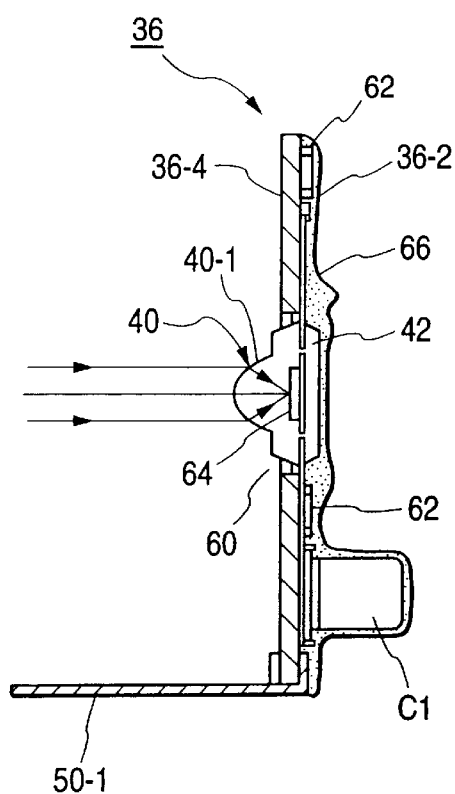

FIG. 6B is a cross-sectional view showing the hybrid circuit board 36. The integrated circuit 42 is mounted on the part mount surface 36-2 of the hybrid circuit 36 and in the center opening 60 while being turned upside down. A light-receiving element and circuitry including an amplifying circuit for the light-receiving element are integrated into an IC chip 64. The IC chip 64 is incorporated in the integrated circuit 42. The lens section 40-1 is located integrally in front of the light-receiving element of the IC chip 64, thereby constituting the light receiving section 40. The light-receiving element of the IC chip 64 is provided so as to be situated at the focal point of the lens section 40-1. The IC chip 64 is bonded to the ground portion of the lead frame provided in the integrated circuit 42 and is less prone to noise.

The integrated circuit 42, the capacitor C1, and the chip components 62 mounted on the part mount surface 36-2 of the hybrid circuit board 36 are wholly coated with a coating layer 66 such as epoxy resin, thus enhancing corrosion resistance of the hybrid circuit board 36. Such a structure of the hybrid circuit board 36 enables interconnection of the integrated circuit 42, the chip components 62 serving as discrete components, and the capacitor C, which remain mounted on the part mount surface 36-2, by means of solder reflow, without imparting influence to the light receiving section 40 of the integrated circuit 42. Further, only a single side of the hybrid circuit board 36; that is, the part mount surface 36-2, is subjected to dip coating, thus forming the coating layer 66. Thus, assembly of the hybrid circuit board 36 is easy, and costs of the hybrid circuit board 36 can be curtailed correspondingly.

Figure 6C:
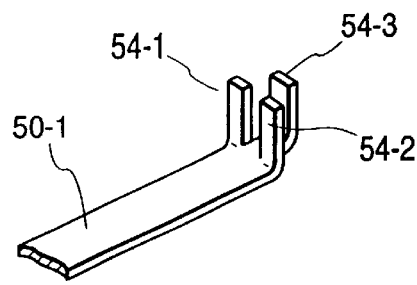

Taking the lead metal fitting 50-1 as an example, lead metal fitting to be fixedly connected to the hybrid circuit board 36 assumes a fitting structure such as that shown in FIG. 6C. A pair of lugs 54-1 and 54-2 are formed, by means of upwardly bending, at the end of the lead metal fitting 50-1 to be attached to the hybrid circuit board 36. A fitting lug 54-3 is formed, by means of bending, between and spaced apart from the lugs 54-1 and 54-2 by a distance corresponding to the thickness of the hybrid circuit board 36. As shown in FIG. 6B, the end face of the hybrid circuit board 36 is fitted into and fixedly connected to the space defined between the fitting lugs 54-1, 54-2 and the fitting lug 54-3, through soldering.

Figure 7:
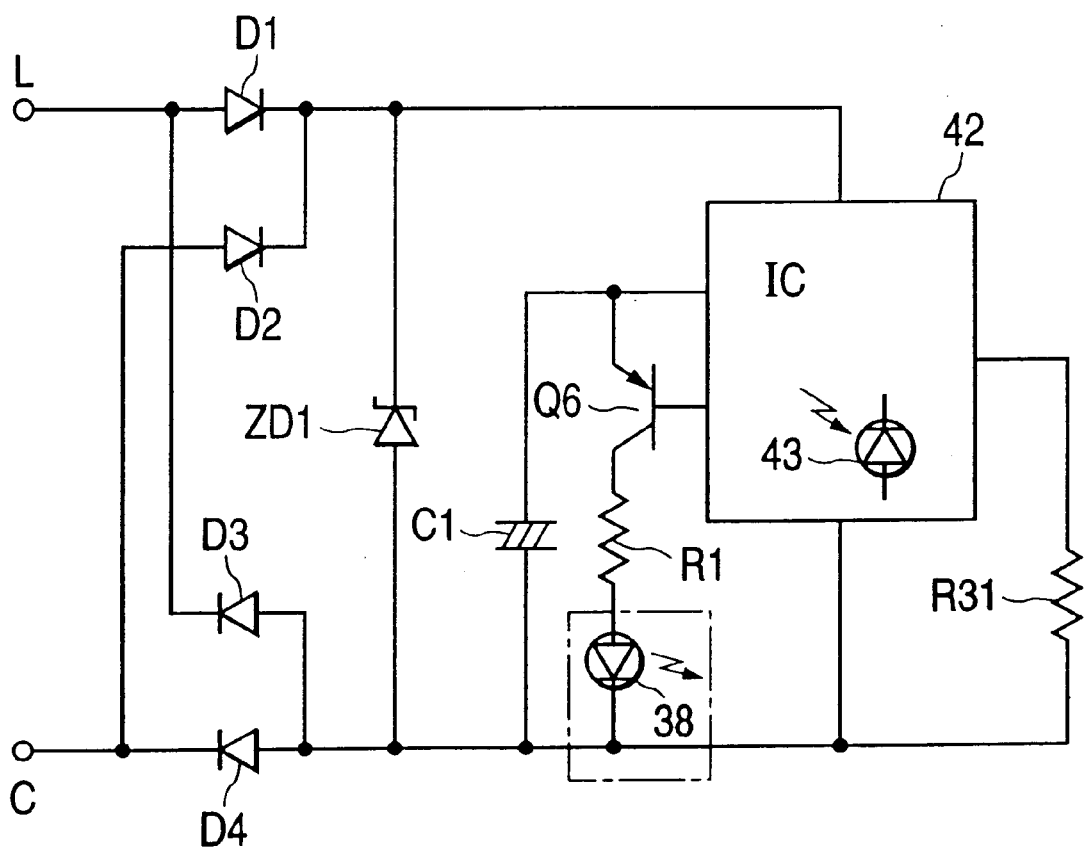
FIG. 7 is a circuit diagram showing a detector circuit mounted on the hybrid circuit board shown in FIG. 5.

FIG. 7 is a circuit diagram showing a detector circuit mounted on the hybrid circuit board 36 according to the present invention.

As shown in FIG. 7, the only requirement is that, a total of ten parts; i.e., diodes D1 through D4; a Zener diode ZD1, the capacitor C1, a transistor Q6, resistors R1 and R36, and the integrated circuit 42, be mounted on the hybrid circuit board 36. The light-emission element 38 is connected to the hybrid circuit board 36 by way of the pieces of first lead metal fitting 50-1 and 50-2.

The diodes D1 to D4 constitute a diode bridge which serves as a rectifier circuit for terminals L and C. The Zener diode ZD1 serves as a noise absorption circuit. The capacitor C1 supplies electric current to the light-emission element 38 which is activated by an oscillator circuit provided in the integrated circuit 42. The resistor R1 sets the electric current flowing through the light-emission element 38. The transistor Q6 switches the light-emission element 38. The resistor R31 sets a reference voltage of a comparator circuit.

Figure 8:
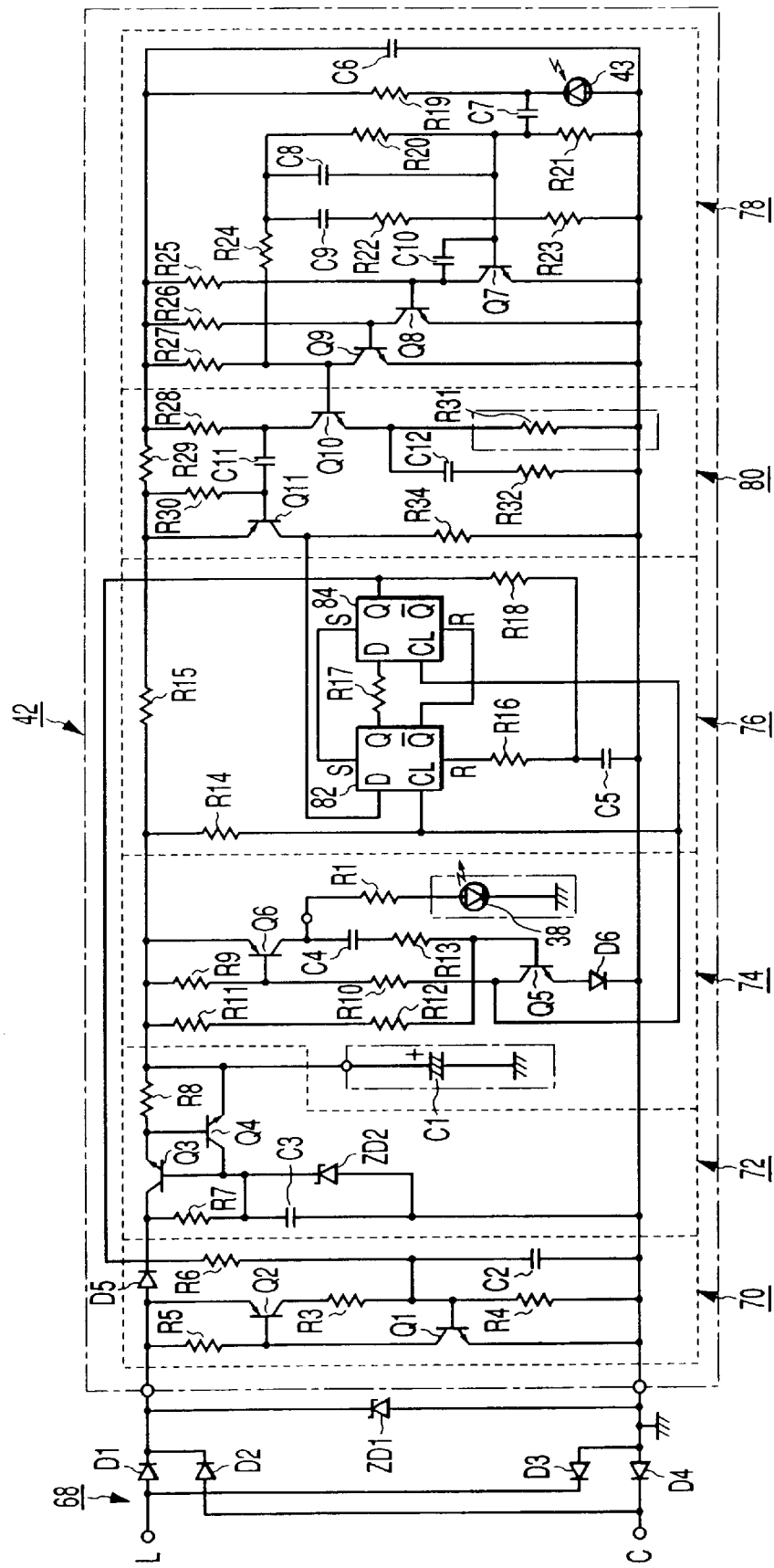
FIG. 8 is a circuit diagram showing details of the detector circuit shown in FIG. 7.

FIG. 8 is a circuit diagram showing details of the detector circuit shown in FIG. 7. The detector circuit according to the present invention is of conventional type and comprises a rectification/noise absorption circuit 68, a fire signal output circuit 70, a constant-voltage/current limit circuit 72, an oscillator circuit 74, a counter circuit 76, a comparator circuit 80, and an amplifying circuit 78.

Of these circuits, the rectification/noise absorption circuit 68, the capacitor C1 for supplying light-emission current to the oscillator circuit 74, the transistor Q6 for switching the light-emission element 38 which is activated by the oscillator circuit 74, a current limit resistor R1, and a resistor R31 for setting a reference voltage of the comparator circuit are constituted as external circuits made of electric parts serving. Circuits other than these circuits are provided in the integrated circuits 42.

The sensor circuit will be described in more detail as follows: The sensor circuit has the terminals L and C connected to lead wires (sensor wires) which are to act as power/signal lines connected to a disaster-prevention monitor panel. The terminals L and C are followed by the rectification/noise absorption circuit 68, which has a diode bridge consisting of the diodes D1 to D4 and the Zener diode ZD1.

The rectification/noise absorption circuit 68 is followed by a self-holding-type fire signal output circuit 70. This self-holding-type fire signal output circuit 70 comprises transistors Q1 and Q2, resistors R4 through R6, a capacitor C2, and a diode D5. The transistors Q1 and Q2 are turned on by means of a signal output from the counter circuit 76, thereby causing a disaster warning current to flow to the terminals L and C. Eventually, a fire signal is sent to the disaster-prevention monitor panel.

The fire signal output circuit 70 is followed by the constant-voltage/current limit circuit 72 constituting a power circuit. A constant-voltage circuit is constituted of a transistor Q4, a resistor R7, a capacitor C3, and a Zener diode ZD2. Further, a current limit circuit is constituted of the transistor Q4 and a resistor R8.

The constant-voltage/current limit circuit 72 is followed by the oscillator circuit 74. The oscillator circuit 74 is constituted of transistors Q5 and Q6, resistors R9 to R13, a capacitor C4, and a diode D6. For instance, the transistor Q6 is switched at a cycle of, for example, two seconds, thereby causing a light-emission current to flow to the light-emission element 38 by way of the current limit resistor R1. The light-emission current flowing to the light-emission element 38 is supplied from the external capacitor C1 connected so as to follow the constant-voltage/current limit circuit 72.

The amplifying circuit 78 will now be described. The amplifying circuit 78 is provided with the light-receiving element 43 using an infrared photodiode. Scattered light is received by the light-receiving element 43 and is converted into a received-light current. The received-light current is amplified by the amplifying circuit 78 comprising transistors Q7 to Q9, resistors R20 to R27, and capacitors C6 to C9.

The amplifying circuit 78 is followed by the comparator circuit 80. The comparator circuit 80 is made up of transistors Q10 and Q11, resistors R28 through R34, and capacitors C1 and C12. When a signal output from the amplifying circuit 78 exceeds a predetermined threshold value, the transistors Q10 and Q11 are turned on, and an H-level received-light signal is output to the counter circuit 76 in synchronism with an oscillation pulse signal.

The counter circuit 76 is constituted of delayed flip-flop (D-FF) circuits 82 and 84., resistors R14 to R18, and a capacitor C5. When H-level signals are continuously output twice from the comparator circuit 80 in synchronism with a clock of an oscillator pulse signal output from the oscillator circuit 74, a signal Q output from a D-FF circuit 84 on an output stage is brought from a low level to a high level, thereby turning on the transistors Q1 and Q2 of the fire signal output circuit 70. The fire signal is sent to the disaster-prevention monitor panel.

The transistors Q1 and Q2 of the output circuit 70 constitute a latch circuit. As a result of the signal Q output from the D-FF circuit 84 on the output stage of the counter circuit 76 becoming high, output of the fire signal is maintained even when the D-FF circuits 82 and 84 are reset by a time constant defined by the capacitor C5 and the resistor R18, after lapse of a predetermined period of time. The smoke detecting circuit is constituted of the comparator circuit 80 and the counter 76.

The circuit configuration of the integrated circuit 42 shown in FIGS. 7 and 8 is a mere example. As a matter of course, the circuit configuration of the integrated circuit 42 may be changed, as required, so long as at least the light-receiving element 43 and the amplifying circuit 78 are integrated.

The integrated circuit 42 may be formed from plurality of integrated circuits by combination of a first integrated circuit comprising the light-receiving element 43 and the amplifying circuit 78 with a second integrated circuit comprising remaining circuits.

Figure 9:
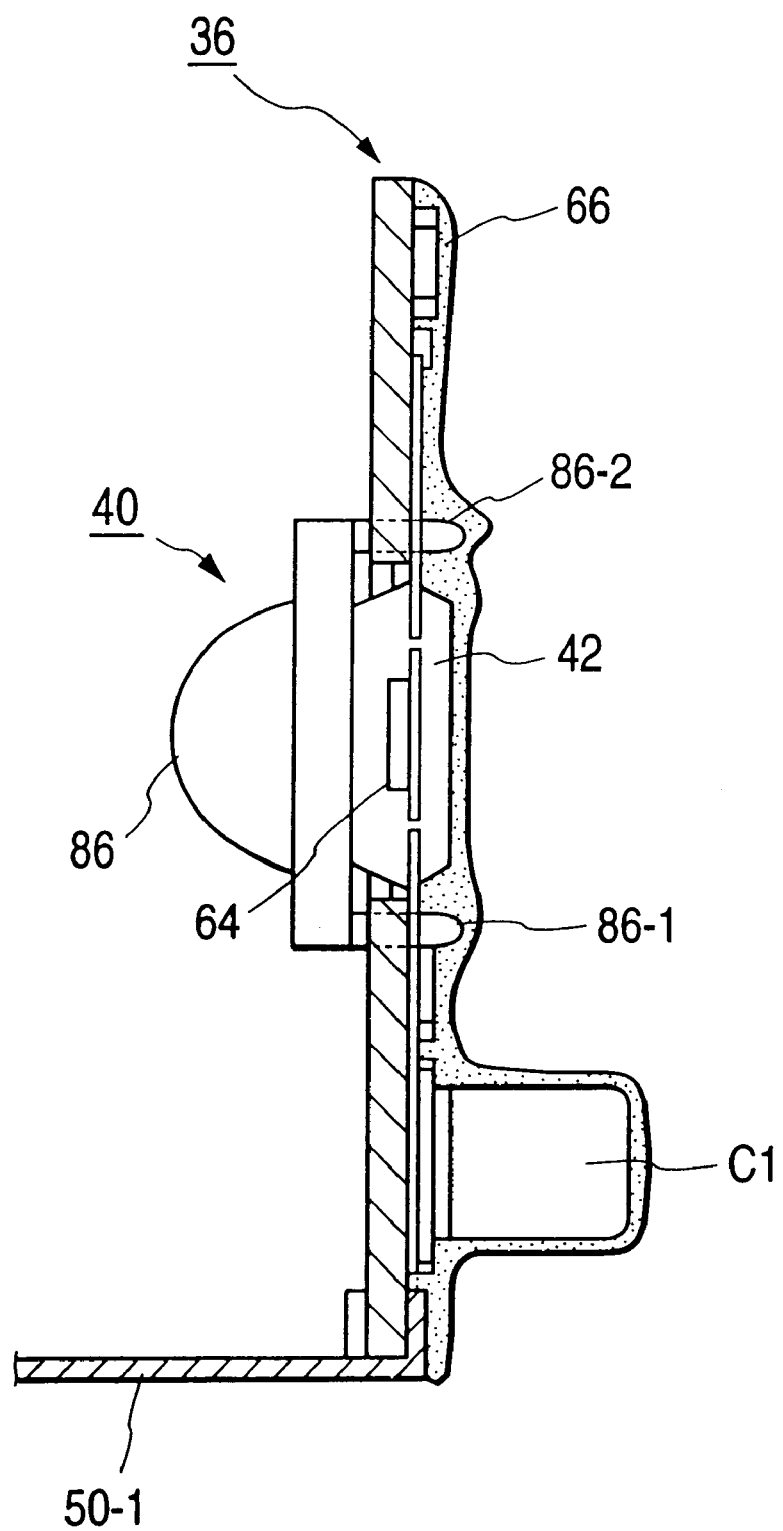
FIG. 9 is a cross-sectional descriptive view showing another embodiment of the hybrid circuit board, in which a lens unit is separated from a light receiving section.

FIG. 9 is a cross-sectional view showing another embodiment of the hybrid circuit board 36 used in the photoelectric smoke detector according to the present invention. FIG. 9 is a cross-sectional view of the hybrid circuit board 36 when the board 36 is assembled. In this embodiment, a lens unit 86 of the light receiving section 40 can be separated from the integrated circuit 42.

The integrated circuit 42 is fitted into the opening 60 of the hybrid circuit board 36 from the underside thereof. The hybrid circuit board 36 is subjected to solder reflow after the capacitor C1 and the chip components 62 have been mounted on the reverse side of the hybrid circuit board 36. The lens unit 86 is attached to the light-receiving side of the integrated circuit 42, and the coating layer 66 is formed over the reverse side of the hybrid circuit board 36, thereby fixing the capacitor C1 and the chip components 62.

Projections 86-1 and 86-2 provided on the lens unit 86 are fitted into insert holes formed at positions corresponding to the hybrid circuit board 36. In this state, the coating layer 66 is formed over the component mount surface 36-2, thereby bonding the projections 86-1 and 86-2 to the hybrid circuit board 36.

Thus, the lens unit 86 is separated from the integrated circuit 42. Therefore, in contrast with a case where the lens section 40-1 is formed integrally with the integrated circuit 42, as shown in FIG. 6B, a larger lens can be used. Further, a general-purpose package can be used without involvement of a new metal mold with a lens being formed for an integrated circuit.

Figure 10:
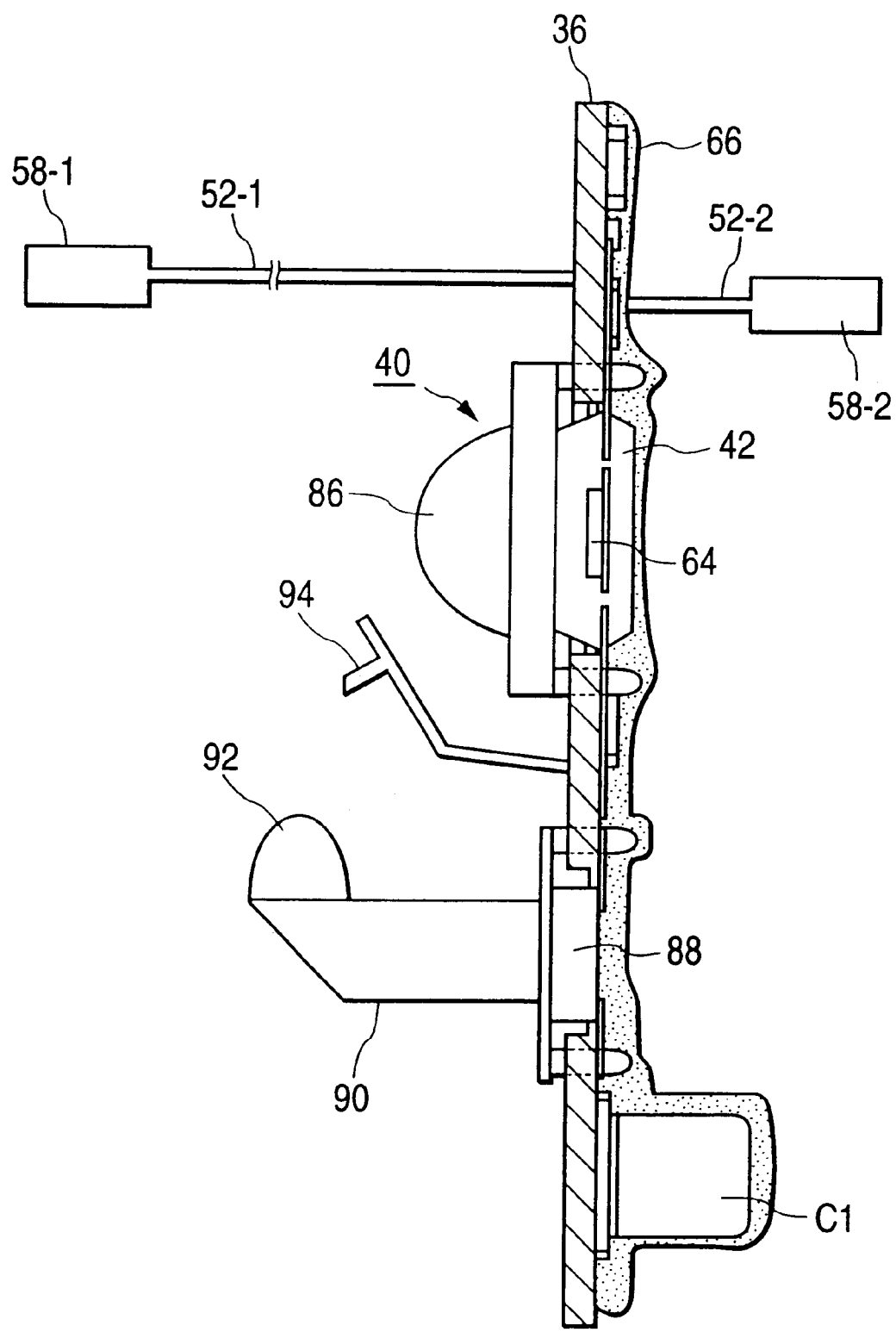
FIG. 10 is a cross-sectional descriptive view showing another embodiment of the hybrid circuit board, in which a light emission section is mounted on the circuit board.

FIG. 10 shows yet another embodiment of the hybrid circuit board 36 used in the photoelectric smoke detector according to the present invention. This hybrid circuit board 36 is characterized by addition of a light emission section.

As shown in FIG. 10, the light receiving section of the hybrid circuit board 36 is identical with that employed in the embodiment shown in FIG. 9. In other words, the lens unit 86 is separated from the light receiving section. In addition, a surface-mounted light-emission element 88 is mounted at a position below the lens unit 86. An optical member integrally consisting of a light guide 90 and a light-emission lens 92 is attached to the light-emission element 88.

The optical member consisting of the light guide 90 and the light-emission lens 92 can be readily made of transparent plastic material, such as transparent acrylic resin or the like. While the optical member is built into the smoke detecting section, a shield plate 94 is positioned between the lens unit 86 and the light-emission lens 92 of the light receiving section 40, thereby embodying a smoke detecting structure of scattered-light type.

Since the light emission section is fixedly supported by the hybrid circuit board 36, there is obviated a necessity for use of the pair of pieces of lead metal fitting 50-1 and 50-2 for fixedly supporting the light-emission element 38 in a smoke detecting space, as designated by the smoke detection section assembly 16 shown in FIGS. 3 and 4. The structure of the smoke detection section assembly 16 can be simplified correspondingly.

Figure 11:
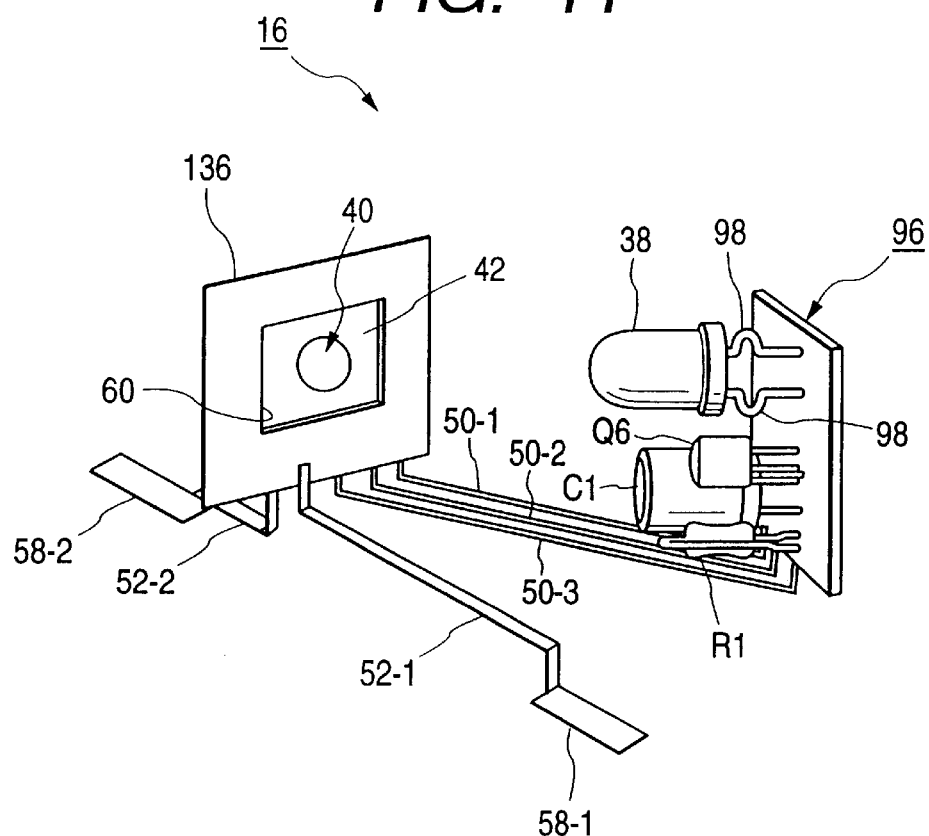
FIG. 11 is a descriptive view showing a smoke detection section assembly according to the present invention, in which a light emission section circuit board is separated from a light receiving section hybrid circuit board.

FIG. 11 shows another embodiment of the smoke detection section assembly 16 used in the photoelectric smoke detector according to the present invention. In this smoke detection section assembly 16, circuits of the light emission section to which a current of comparatively large magnitude must flow is separated from the hybrid circuit board 36, and the thus-separated circuit is provided on a light-emission circuit board 96.

In the hybrid circuit board 36 according to the embodiment shown in FIG. 3, the transistor Q6, the current limit resistor R1, and the capacitor C1, which are included in the sensor circuit shown in FIG. 8 and into which a current of comparatively large magnitude flows, are provided along with the light-receiving circuit which is susceptible to noise. Therefore, when a large light-emission current flows to the light-emission element, there is chance of noise being emitted from a pattern or a lead wire routed on a board, thus adversely affecting the light-receiving circuit.

For this reason, in the embodiment shown in FIG. 11, an electric component on the light-emission circuit section into which a current of comparatively large magnitude flows is separated from a hybrid circuit 136 and provided on the light-emission circuit board 96 together with the light-emission element 38. The light-emission circuit board 96 is fixedly housed in the light emission section holder 32.

Figure 12:
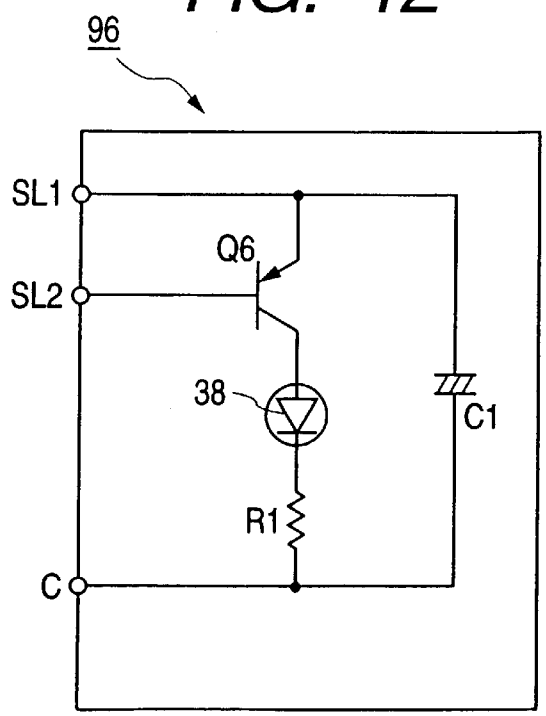
FIG. 12 is a circuit diagram showing the light-emission circuit board shown in FIG. 11.

FIG. 12 is a circuit diagram of the light-emission circuit board 96 shown in FIG. 11. The four components provided in the sensor circuit shown in FIG. 8; that is, the switching transistor Q6, the light-emission element 38, the current limit resistor R1, and the electrolytic capacitor C1, are mounted on the light-emission circuit board 96.

The resistance of the current limit resistor R1 is selected in accordance with the brightness of the light-emission element 38. More specifically, the brightness of the light-emission element 38 mounted on the light-emission circuit board 96 is determined by the current limit resistor R1. Therefore, a variable resistor may be used as the current limit resistor R1. Further, the circuit of the light-emission circuit board 96 is connected to the hybrid circuit board 136 by way of three terminals; that is, a terminal SL1, a terminal SL2, and a terminal C.

Turning again to FIG. 11, the three pieces of lead metal fitting 50-1, 50-2, and 50-3 are connected at one end and fixedly supported by the hybrid circuit board 136. The three pieces of metal fitting 50-1, 50-2, and 50-3 are fixedly connected and supported at the other end thereof to and at the light-emission circuit board 96 by way of the three terminals SL1, SL2, and C shown in FIG. 12. Further, the light-emission circuit board 96 is positioned such that the optical axis of the light-emission element 38 mounted on the light-emission circuit board 96 and the optical axis of the light receiving section 40 cross each other at a predetermined angle.

In order to facilitate positioning of the optical axis of the light-emission element 38, looped sections 98 are formed in lead sections of the light-emission element 38. By means of mechanically bending the looped sections 98 of the lead sections, easy adjustment of the optical axis of the light-emission element 38 is enabled. Thus, there can be set a correct cross angle with respect to the optical axis of the light receiving section 40. After the optical axis of the light emission section 38 has been determined, the leads of the light emission section 38 are potted through use of resin, thus protecting the light-emission element 38 from physical impact or vibration.

As a matter of course, as in the case of the circuit shown in FIG. 3, the lead metal fitting 52-1 having the base contact section 58-1 to be attached to a mount base and the lead metal fitting 52-2 having the base contact section 58-2 to be attached to a mount base are also connected to the hybrid circuit board 136.

The following advantage is yielded by the circuit configuration shown in FIG. 11, in which the light emission section through which a current of comparatively large magnitude flows is separated from the hybrid circuit board 136 and is provided as the light-emission circuit board 96.

Noise which is imposed on the amplifying circuit on the light-receiving circuit side as a result of light-emission driving operations is greatly diminished. Even in a case where the sensitivity of the light-emission element 38 cannot be adjusted fully at the time of manufacture of the smoke detection section assembly 16, there is no necessity of handling as defective the entire hybrid circuit board 36 such as that shown in FIG. 3. The only requirement is that the light-emission circuit board 96 be taken as defective. Therefore, an assembly yield can be improved correspondingly, or the present invention can readily cope with manufacture of ranked products of greatly-different sensitivity.

Since the light-emission circuit board 96 is separated from the hybrid circuit board 136, the hybrid circuit board 136 of the light receiving section having the integrated circuit 42 mounted thereon can be made compact. The light-emission circuit board 96 has a size matching the size of a housing space originally formed in the light emission section holder. In contrast, the hybrid circuit board 136 provided on the light emission section side can be made compact. Therefore, the light receiving section holder can be made compact correspondingly, and the characteristic of smoke flowing into the smoke detecting space from the outside can be improved.

Figure 13:
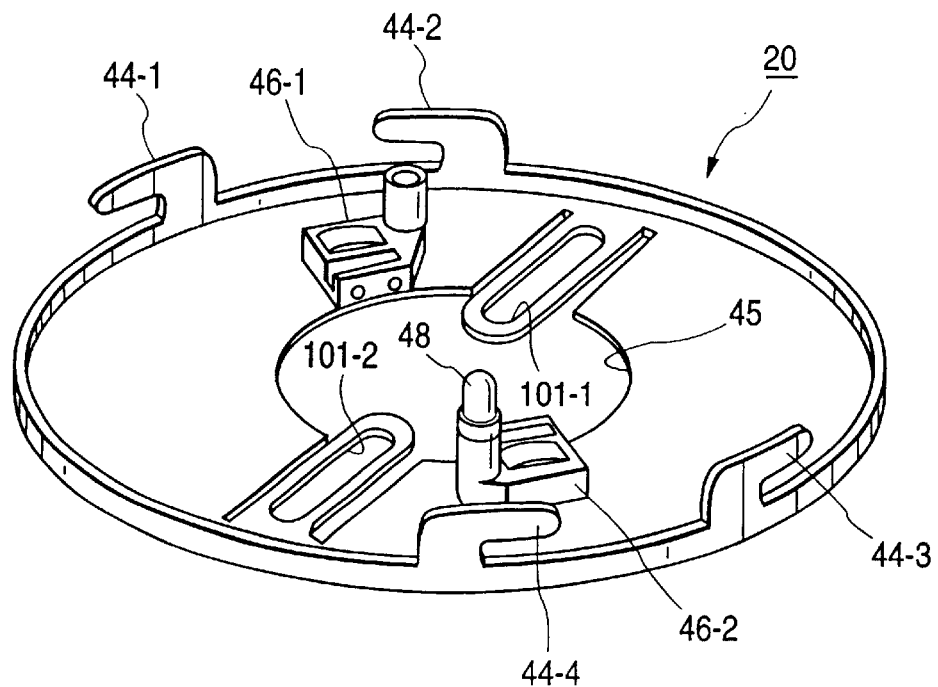
FIG. 13 is a descriptive view showing a thin mount base used in the present invention.

FIG. 13 shows the mount base 20 to be used in mounting the photoelectric smoke detector 10 on the ceiling. As has been described in connection with the exploded view shown in FIG. 2, the mount base 20 corresponds to a thin disk-shaped member formed from a metal plate. The four fitting pieces 44-1 through 44-4 are formed at respective positions so as to project toward surroundings, and the wire through-hole 45 is formed in the center of the mount base 20. Further, the pair of mount screw through holes 101-1 and 101-2 are formed along the wire through hole 45 so as to become opposite each other.

While the mount base 20 is attached to the ceiling, the terminal blocks 46-1 and 46-2 are secured on the down-facing surface of the mount base 20. Further, the disaster warning indication lamp 48 is fitted to the terminal block 46-2.

Figure 14A:
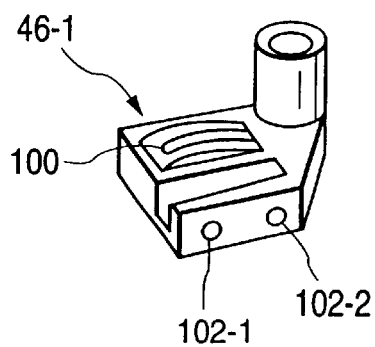
FIGS. 14A to 14B are descriptive views showing a terminal unit attached to the mount base shown in FIG. 13.
Figure 14B:
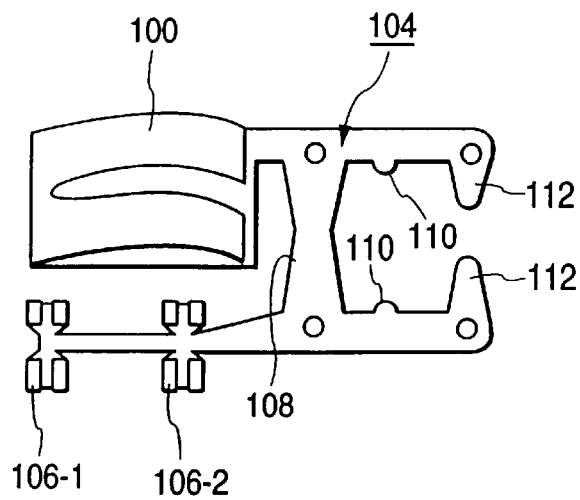

FIGS. 14A and 14B show the terminal block 46-1 shown in FIG. 13. As shown in FIG. 14A, the detector contact section 100 is provided on the surface of a substantially-rectangular block member. A pair of lead wire insert holes 102-1 and 102-2 are formed in the side surface of the detector contact section 100.

Terminal metal fitting 104 having a structure such as that shown in FIG. 14B is fitted into the terminal block 46-1 molded of insulating synthetic resin. The terminal metal fitting 104 has the detector contact section 100 and lead wire contact sections 106-1 and 106-2 located in the lead wire insert holes 102-1 and 102-2.

The terminal metal fitting 104 has a connection section 108 for interconnecting the detector contact section 100 and the lead wire contact sections 106-1 and 106-2. On the side of the connection section 108 opposite to the detector contact section 100, there are formed a resistor connection section 110 and a disaster warning indication lamp connection section 112 such that the resistor connection section 110 is formed from two separated portions and such that the disaster warning indication lamp connection section 112 is formed from two separated portions.

Figure 15A:
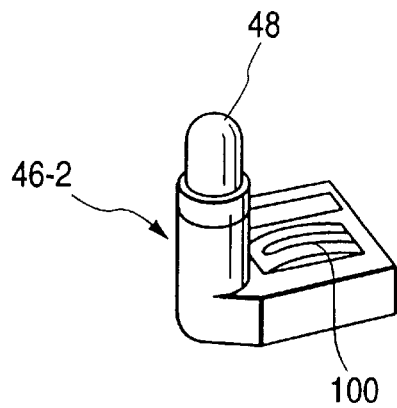
FIGS. 15A and 15B are descriptive views showing a terminal unit with a disaster warning indicating lamp, the unit being attached to the mount base shown in FIG. 13.
Figure 15B:
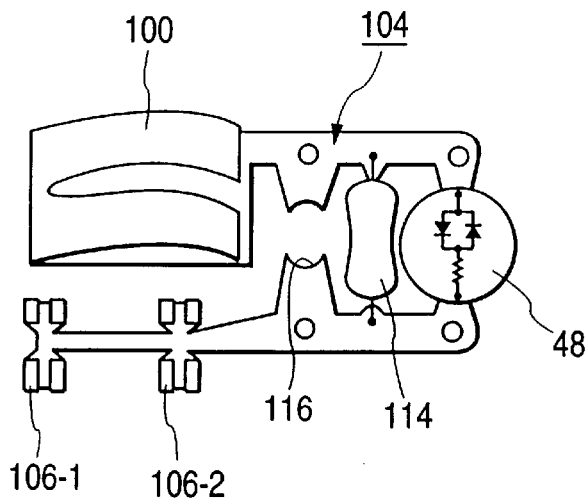

FIGS. 15A and 15B show the terminal block 46-2 shown in FIG. 13, wherein the disaster warning indication lamp 48 is attached to the terminal block 46-2. As in the case of the terminal block 46-1 shown in FIGS. 14A and 14B, the terminal block 46-2 is provided with the detector contact section 100. Further, the pair of lead wire insert holes 102-1 and 102-2 are formed in the side surface of the terminal block 46-2 facing the terminal block 46-1, as in the case of the terminal block 46-1 shown in FIGS. 14A and 14B.

FIG. 15B shows the terminal metal fitting 104 to be fitted into the terminal block 46-2. As in the case of the terminal block 104 shown in FIG. 14B, the terminal metal fitting 104 has the detector contact section 100 and the pair of lead wire contact sections 106-1 and 106-2. In addition, a resistor 114 and the disaster warning indicating lamp 48 of non-polarity are connected to the terminal block 104. The connection section 108 shown in FIG. 14B is cut by means of punching or a like method, thus forming a disconnection section 116.

As mentioned above, each of the terminal blocks 46-1 and 46-2 to be mounted on the mount base 20 employ the same terminal metal fitting 100 basically. If the terminal metal fitting 100 is provided with the resistor 114 and the disaster warning indicating lamp 48 and the connection section 108 is separated, there can be obtained the terminal block 46-2 having the disaster warning indicating lamp 48 such as that shown in FIG. 15A.

Figure 16:
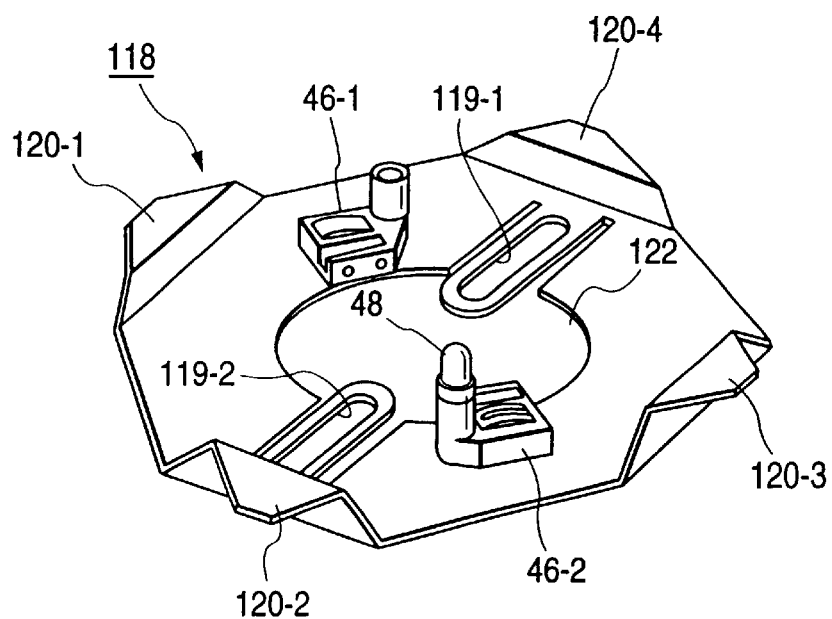
FIG. 16 is a descriptive view showing a polygonal mount base used in the present invention.

FIG. 16 shows another embodiment of the mount base 20 to be used with the photoelectric smoke detector according to the present invention. As shown in FIG. 16, the mount base is embodied as a polygonal mount base 118 in the present embodiment. Corners of a rectangular plate are bent, to thereby form fitting pieces 120-1 to 120-4.

In contrast with the mount base 20 shown in FIG. 13 in which fitting pieces are formed so as to project upward, sheet-metal working of a mount base becomes more facilitated. The mount base 118 has a wire through hole 112, mount screw through holes 119-1 and 119-2, and the pair of terminal blocks 46-1 and 46-2, as does the mount base 20.

Figure 17:
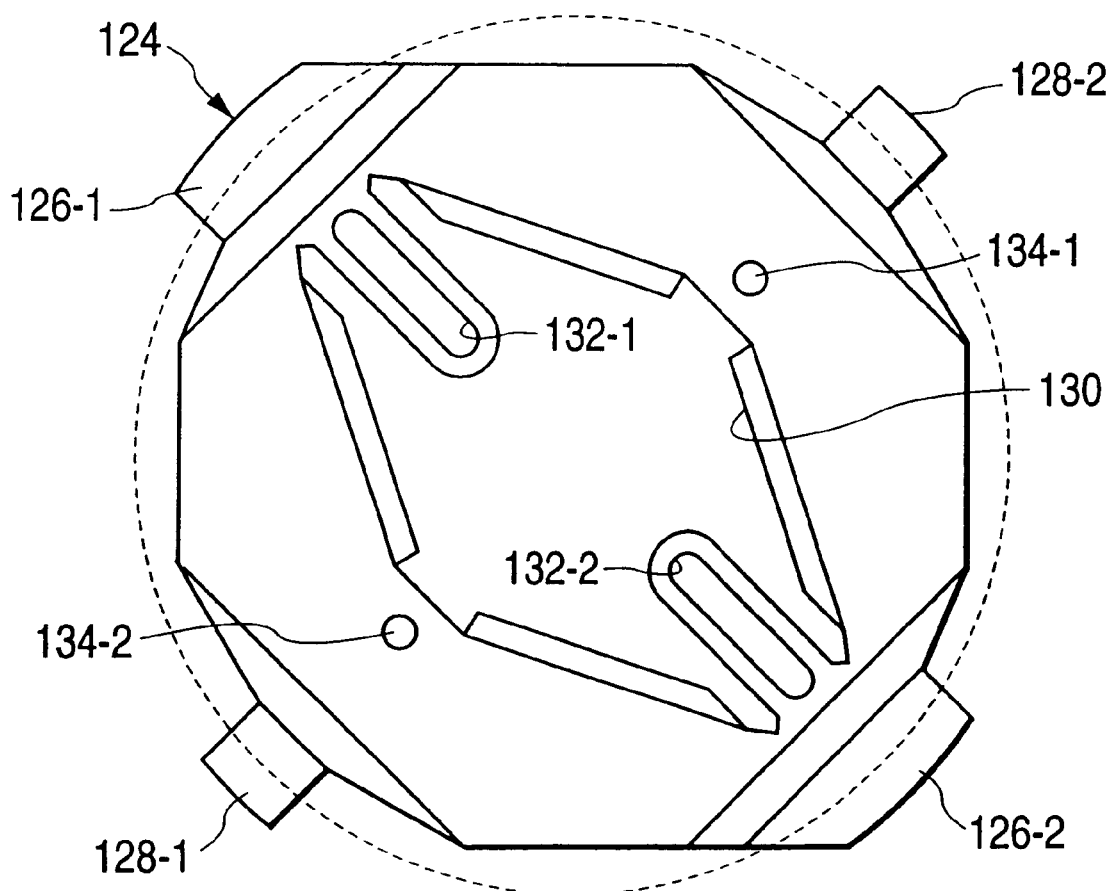
FIG. 17 is a descriptive view showing another embodiment of a polygonal mount base used in the present invention.

FIG. 17 is a developed view of a polygonal mount base according to still another embodiment of the present invention. In the case of a polygonal mount base 124, after a metal plate has been formed into a polygonal shape matching the circular shape of the photoelectric smoke detector, fitting pieces 126-1 and 126-2 and fitting pieces 128-1 and 128-2, which differ in shape with each other, are spaced apart 90° apart from one another along the periphery of the polygonal mount base 124. These fitting pieces enable a rotational fitting operation through only an angle of 180°.

A wire through hole 130 formed in the center of the polygonal mount base 124 assumes a substantially rhomboid shape. End faces of the wire through hole 130 are bent, to thereby enhance the strength of the wire through hole 130. A pair of mount screw through holes 132-1 and 132-2 are provided on respectively mutually-opposing corners so as to mutually oppose along the longitudinal axis of the rhomboid. Mount holes 134-1 and 134-2 used for mounting the terminal blocks 46-1 and 46-2 are formed in respective positions so as to cross the longitudinal line at right angles.

As a matter of course, the mount base used for a photoelectric smoke detector according to the present invention is not limited to the foregoing embodiments. So long as fitting pieces are provided along the periphery of a mount base and a wire through hole and mount screw through holes are formed in the mount base, the mount base can be formed from a thin metal plate by means of sheet-metal working.

Figure 18:
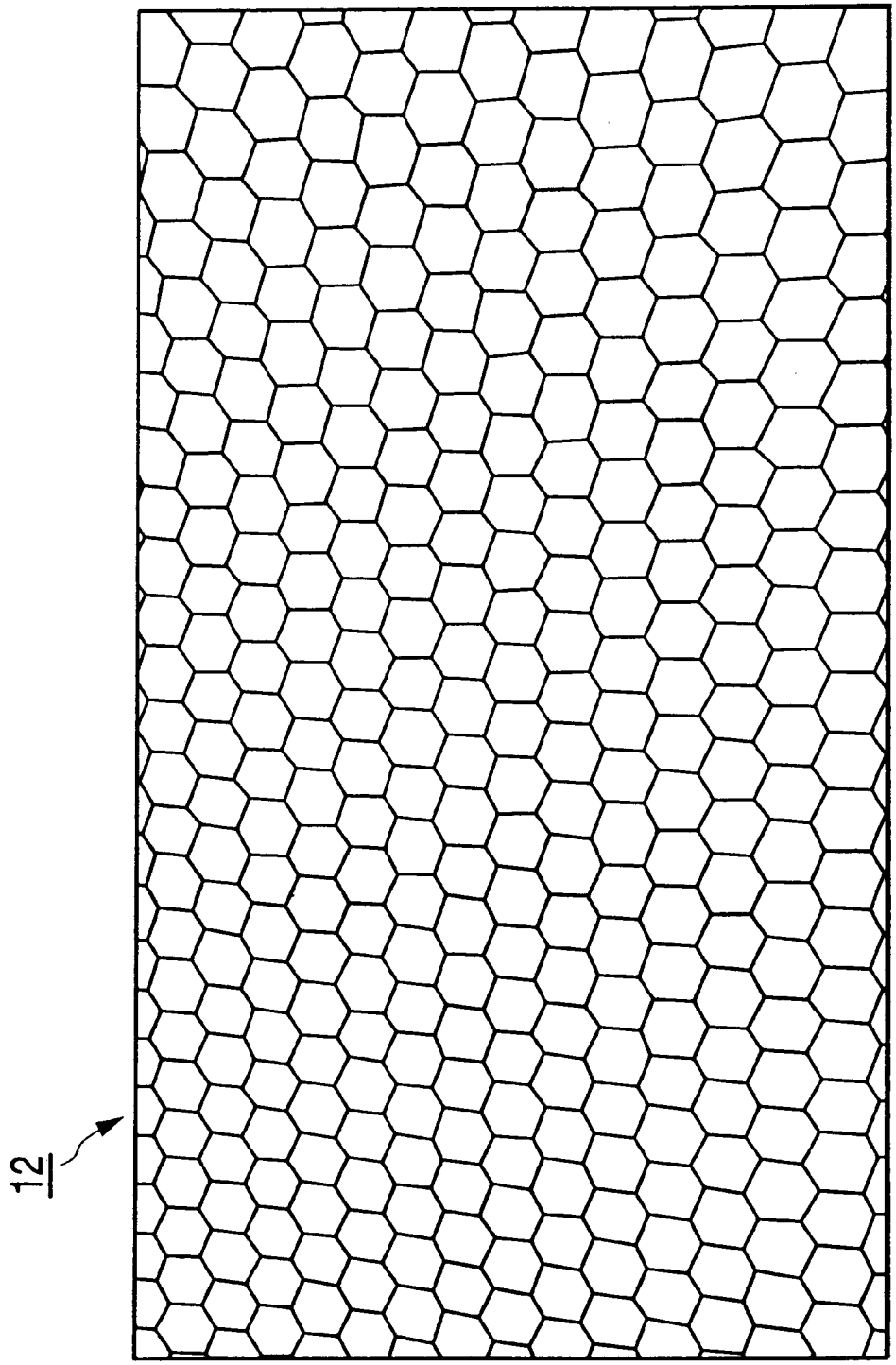
FIG. 18 is an enlarged descriptive view showing an insect screen employed by the present invention.

FIG. 18 is an enlarged view of the insect screen 12 used in the photoelectric smoke detector according to the present invention. The insect screen 12 is made from soft fiber mesh, the mesh being woven from metal fiber or chemical fiber. Before assembly of the smoke detector, the insect screen 12 is flat, as shown in FIG. 2. However, when the smoke detecting section 14 is assembled into the exterior cover 1, the insect screen is positioned around and at the bottom of the smoke detecting section, as shown in FIG. 1. Consequently, the insect screen 12 prevents intrusion of insects from outside.

The insect screen 12 can be easily removed by means of removal of the exterior cover 1, and debris can be easily removed from the insect screen 12 by means of washing. As is evident from the exploded view shown in FIG. 2, when the smoke detector is cleansed by removal of the exterior cover 1, a lower portion of the smoke detecting section 14 is open. Therefore, grime can be easily cleaned off the interior of the smoke detecting section 14 in which the light receiving section holder 30 and the light emission section holder 32 are disposed, through use of an aerosol product.

Figure 19:
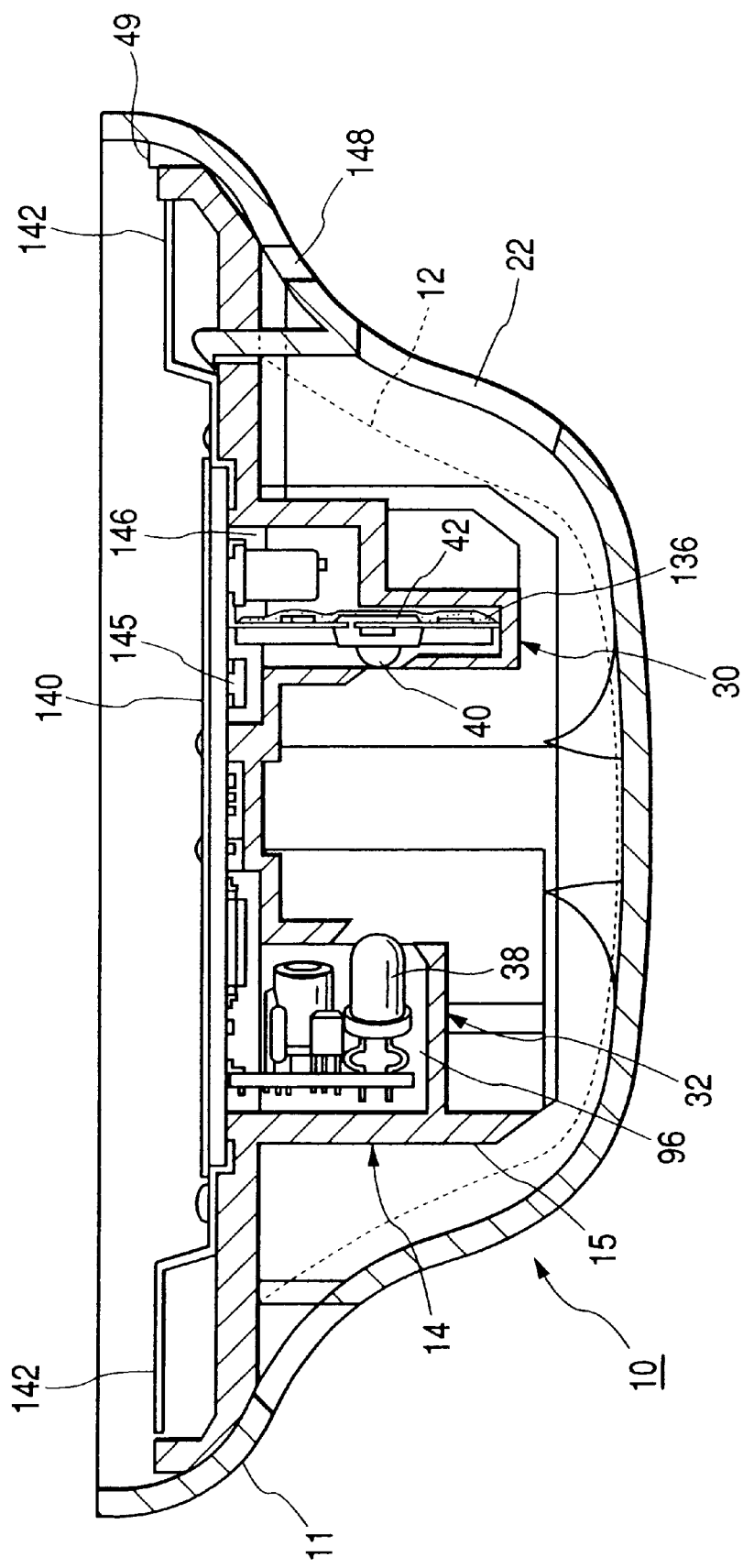
FIG. 19 is a cross-sectional view of a high-performance photoelectric smoke detector according to the present invention.

FIG. 19 is a cross-sectional view showing a high-performance photoelectric smoke detector according to the present invention.

As shown in FIG. 19, the high-performance photoelectric smoke detector 10 comprises the exterior cover 11 and the smoke detecting section 14, with the insect screen 12 being sandwiched between the interior of the exterior cover 11 and the smoke detecting section 14. The plurality of smoke inlet windows 22 are formed along the circumferential surface of the exterior cover 11 of the photoelectric smoke detector 10. The smoke detecting section 14 built into the inside of the exterior cover 11 constitutes a smoke detecting chamber below a smoke detection section main unit 15, and the smoke detecting chamber has an opening. The light receiving section holder 30 and the light emission section holder 32 are provided within the smoke detecting chamber.

A light-emission circuit board 96 having mounted thereon the light-emission element 38 using an infrared LED is built in the light emission section holder 32. A hybrid circuit board 136 is built into the light receiving section holder 30. The integrated circuit 42 equipped integrally with a light receiving section 40 is mounted on the hybrid circuit board 136.

The light-emission circuit board 96 and the hybrid circuit board 136 used in the high-performance photoelectric smoke detector shown in FIG. 19 are of the same type as those employed in the embodiment shown in FIG. 11. Specifically, electric components of light-emission circuitry through which a comparatively large current is to flow are separated from the hybrid circuit board 136, and the thus-separated electric components are mounted on the light-emission circuit board 96 together with a light-emission element. More specifically, as can be seen from the circuit diagram of the light-emission circuit board 96 shown in FIG. 12, four components provided in the detector circuit shown in FIG. 8; namely, the switching transistor Q6, the light-emission element 38, the current limit resistor R1, and the electrolytic capacitor C1, are mounted on the light-emission circuit 96.

Turning again to FIG. 19, in the high-performance photoelectric smoke detector 10, a function addition circuit board 140 having mounted thereon electric circuit components constituting a function addition circuit for constituting a high-performance detector is provided within a circuit storage section defined at a position above the reverse side of the smoke detecting section 14.

The light-emission circuit board 96 incorporated in the light emission section holder 32 and the hybrid circuit board 136 incorporated in the light receiving section holder 30 are fixedly connected to the function addition circuit board 140 behind the reverse side of the smoke detecting section 14.

Figure 20:
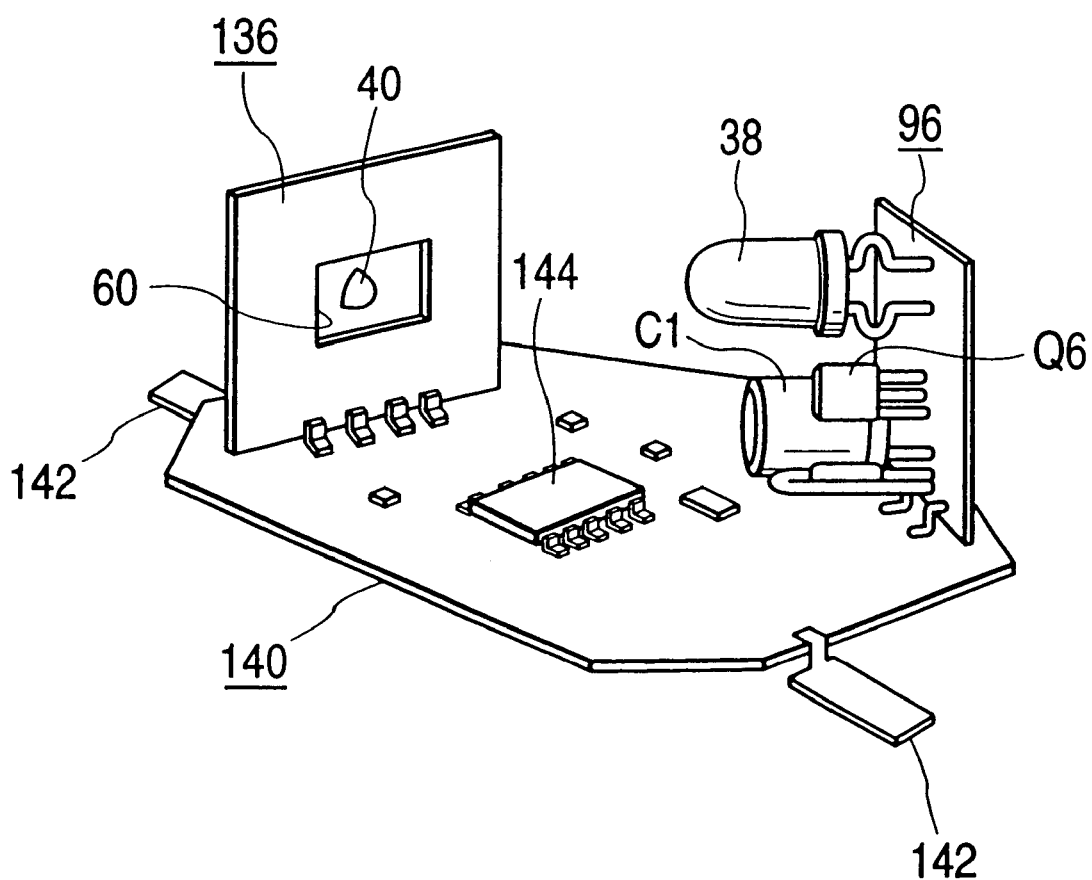
FIG. 20 is a descriptive view of the smoke detection section assembly shown in FIG. 19 having a function addition circuit board.

FIG. 20 shows a smoke detection section assembly having the function addition circuit board 140 shown in FIG. 19. The smoke detection section assembly is embodied by means of fixedly connecting the light-emission circuit board 96 and the hybrid circuit board 136 to the function addition circuit board 140 through soldering.

An electric circuit component 144 is mounted on the side of the function addition circuit board 140, to which side the light-emission circuit board 96 and the hybrid circuit board 136 are fixedly connected. This side opposes the space of the smoke detecting chamber. An upwardly-facing reverse side of the function addition circuit board 140 is flat. When the function addition circuit board 140 is attached to the smoke detecting section 14, as shown in FIG. 19, the electric circuit component 144 is situated so as to oppose the smoke detecting chamber, which is located at a lower position. Thus, the electric circuit component 144 is not exposed to the outside.

The function addition circuit board 140 is provided with a circuit pattern for electrically interconnecting the hybrid circuit 136 and the light-emission circuit board 96.

A pair of pieces of lead metal fitting 142 are connected to the function addition circuit board 140 of the smoke detection section assembly shown in FIG. 20. When attached to the exterior cover 11 shown in FIG. 19, the pieces of lead metal fitting 142 are situated on the ceiling. The pieces of lead metal fitting 142 come into contact with the terminal blocks 46-1 and 46-2 provided on the mount base 20 secured on the ceiling shown in the exploded view of FIG. 2, thereby establishing electrical connection.

The fitting projections 49 are formed on the interior upper portion of the exterior cover 1. The fitting projections 49 are fitted into corresponding fitting pieces 44-1 to 44-4 which are formed along the edge of the mount base 20 so as to project downward, thus fixedly and removably securing the mount base 20.

In the high-performance photoelectric smoke detector 10 shown in FIG. 19, a test LED 145 to be used in a case where the smoke detector 10 is imparted with a remote test function is mounted in a position at which is situated the light-receiving holder 30 having the hybrid circuit board incorporated therein, as well as on the lower surface of the function addition circuit board 140. The test LED 145 is activated to emit light by application of a test signal from the outside. The thus-emitted test light enters the light-receiving element of the integrated circuit 42 provided in the lens section 40, thereby enabling a fire test.

An indication LED 146 is mounted on the function addition circuit board 140. A light guide 148 is provided for the indication LED 146 so as to extend to the exterior cover 11 in a horizontal direction. The light guide 148 guides the light emitted from the indication LED 146, whereby a user can ascertain light emission from a position below the exterior cover 11.

Even in the high-performance photoelectric smoke detector 10 shown in FIGS. 19 and 20, the hybrid circuit 135 having the light receiving section holder 30 incorporated therein and the light-emission circuit board 96 having the light emission section holder 32 incorporated therein are provided within the smoke detecting chamber. The function addition circuit board 140 having mounted thereon a new electric circuit component for attaining high performance is disposed at a position directly above the smoke detecting section so as to cover an upper portion of the smoke detecting section. The electric circuit component is mounted on the side of the function addition circuit board 140 which opposes the smoke detecting chamber. Therefore, even in a case where the function addition circuit board 140 is added to the smoke detector 10 for attaining higher performance, intrusion of noise into lead wires of a light-receiving element built in an integrated circuit and a significant reduction in the number of components are enabled. Moreover, a significant reduction in the number of assembling steps can be attained, and miniaturization of a high-performance detector structure can also be attained in substantially the same manner as mentioned previously.

Figure 21:
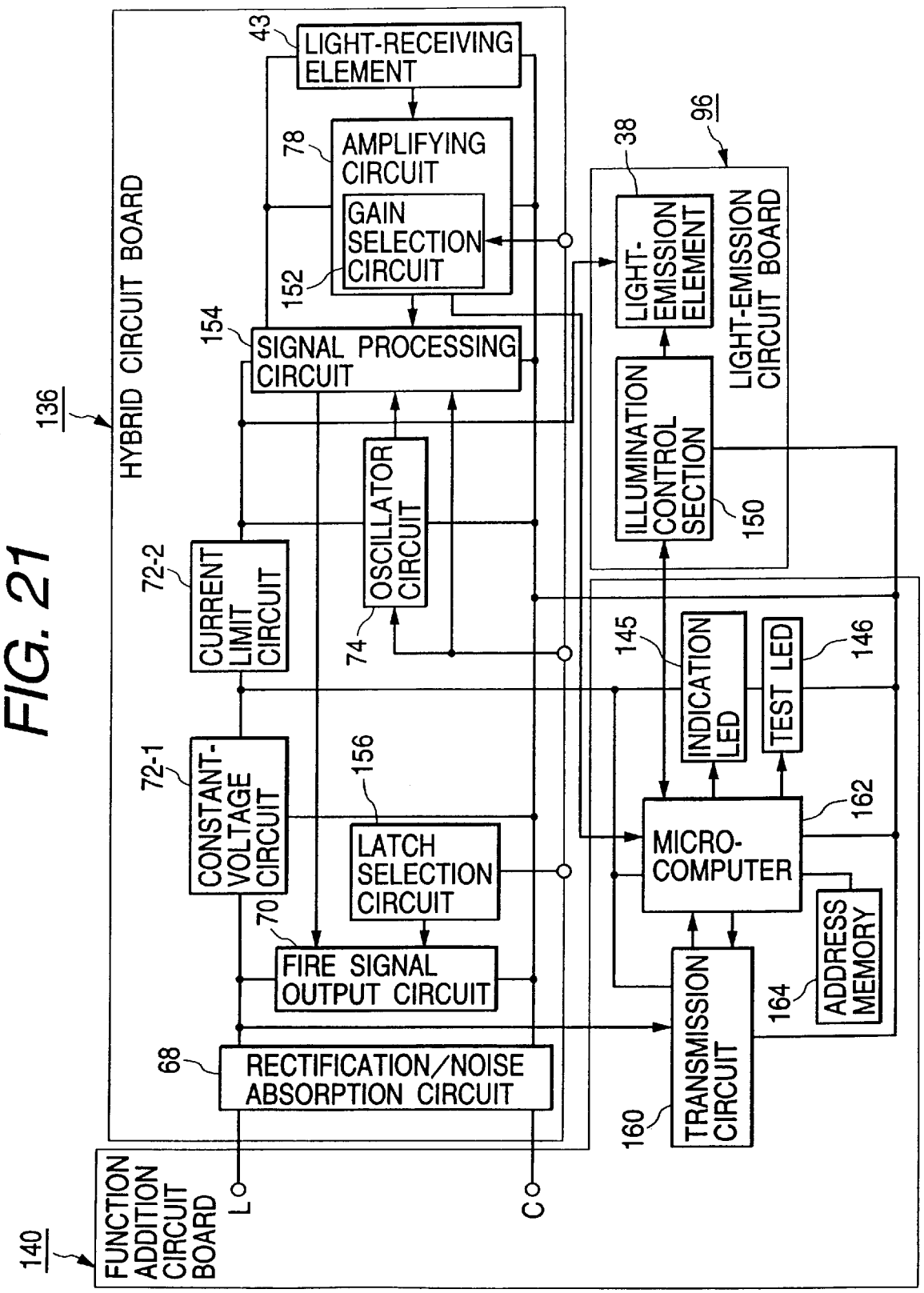
FIG. 21 is a block diagram showing a high-performance photoelectric smoke detector according to the present invention having an additional analog transmission function.

FIG. 21 is a block diagram of a high-performance photoelectric smoke detector according to the present invention to which an analog transmission function is added by means of mounting of a function addition circuit board.

As shown in FIG. 21, the photoelectric smoke detector having an additional analog transmission function is constituted of basic circuitry mounted on both the hybrid circuit board 136 and the light-emission circuit board 96, and an analog transmission circuit section mounted on the function addition circuit board 140.

The basic circuitry mounted on the light-emission circuit board 96 and on the hybrid circuit board 136 essentially corresponds to a block into which the conventional detector circuit shown in FIG. 8 is integrated. More specifically, the light-emission circuit board 96 is provided with a illumination control section 150 and the light-emission element 38; more specifically, the light-emission circuit board 96 is identical with the circuitry shown in FIG. 12.

As in the case of the circuitry shown in FIG. 8, the hybrid circuit board 136 is equipped with the rectification/noise absorption circuit 68, the fire signal output circuit 70, a constant-voltage/current limit circuit 72-1, a constant-voltage/current limit circuit 72-2, the oscillator circuit 74, a signal processing circuit 154 made by combination of a comparator 80 and a counter circuit 76, the amplifying circuit 78, and the light-receiving element 43.

In association with addition of the function addition circuit board 140, the hybrid circuit board 135 is newly provided with a gain selection circuit 152 capable of selecting the gain of the amplifying circuit 78 in response to an external signal, and a latch selection circuit 156 for selecting a latching operation or a non-latching operation of the fire signal output circuit 70.

In order to implement analog transmission of a detection signal from the amplifying circuit 78, the function addition circuit board 140 is provided with a transmission circuit 160, a microcomputer 162 acting as a control circuit, address memory 164 which acts as an address setting circuit, the test LED 145 to be used for a remote test, and the indication LED 146.

In a case where the function addition circuit board 140 is provided in the smoke detector 10 for attaining an analog transmission function, the fire signal output circuit 70, the latch selection circuit 56, the oscillator circuit 74, and the signal processing circuit 154, which are mounted on the hybrid circuit board 136, are disabled.

The high-performance photoelectric smoke detector having the analog transmission function operates as follows.

Upon receipt of a sampling command of given cycle from, for example, a disaster-prevention monitor panel, the microcomputer 162 mounted on the function addition circuit board 140 activates the illumination control section 150 of the light-emission circuit board 96, to thereby cause the light-emission element 38 to emit light.

The light emitted as a result of operation of the light-emission element 38 is scattered by smoke, and the thus-scattered light is received by the light-receiving element 43. The amplifying circuit 78 sends an amplified received-light signal to the microcomputer 162, and the microcomputer 162 converts the signal into received-light data through analog-to-digital conversion. The thus-converted received-light data are retained by the microcomputer 162.

Upon receipt of a sampling command from the disaster-prevention monitor panel by way of the transmission circuit 160, the microcomputer 162 ascertains whether or not a match exists between the address of the command and the address assigned to the microcomputer 162. If a match is ascertained, the received-light data (i.e., analog data) retained in the microcomputer 162 are sent to the disaster-prevention monitor panel as a command in response to a call command, by way of the transmission circuit 160.

A predetermined disaster determination level is set in the microcomputer 162. If the amplified received-light signal output from the amplifying circuit 78 exceeds a disaster determination level, an interrupt signal is immediately sent to the disaster-prevention monitor panel by way of the transmission circuit 160. Upon receipt of the interrupt signal, the disaster-prevention monitor panel searches the photoelectric smoke detector that has issued the interrupt signal. When the photoelectric smoke detector that has issued an interrupt signal is found, the disaster-prevention monitor panel sends a call command in preference to the thus-found photoelectric smoke detector, thereby causing the photoelectric smoke detector to send analog data. Having sent the interrupt signal to the disaster-prevention monitor panel, the microcomputer 162 illuminates the indication LED 145, thus emitting a disaster warning.

If the microcomputer 162 finds that the command sent by way of the transmission circuit 160 is a test command, the microcomputer 162 activates the test LED 146so as to emit light, and the thus-emitted light directly enters the light-receiving element 43, thus performing a test operation. The received-light data output from the amplifying circuit 78 as a result of the test operation are acquired by the microcomputer 162, and the thus-acquired data are sent to the disaster-prevention monitor panel as test data by way of the transmission circuit 160. The disaster-prevention monitor panel creates a test result.

The circuitry mounted on the function addition circuit board 140 for attaining an analog transmission function is not limited to the above-described embodiment. Any circuitry may be used, so long as the circuitry performs analog transmission.

Figure 22:
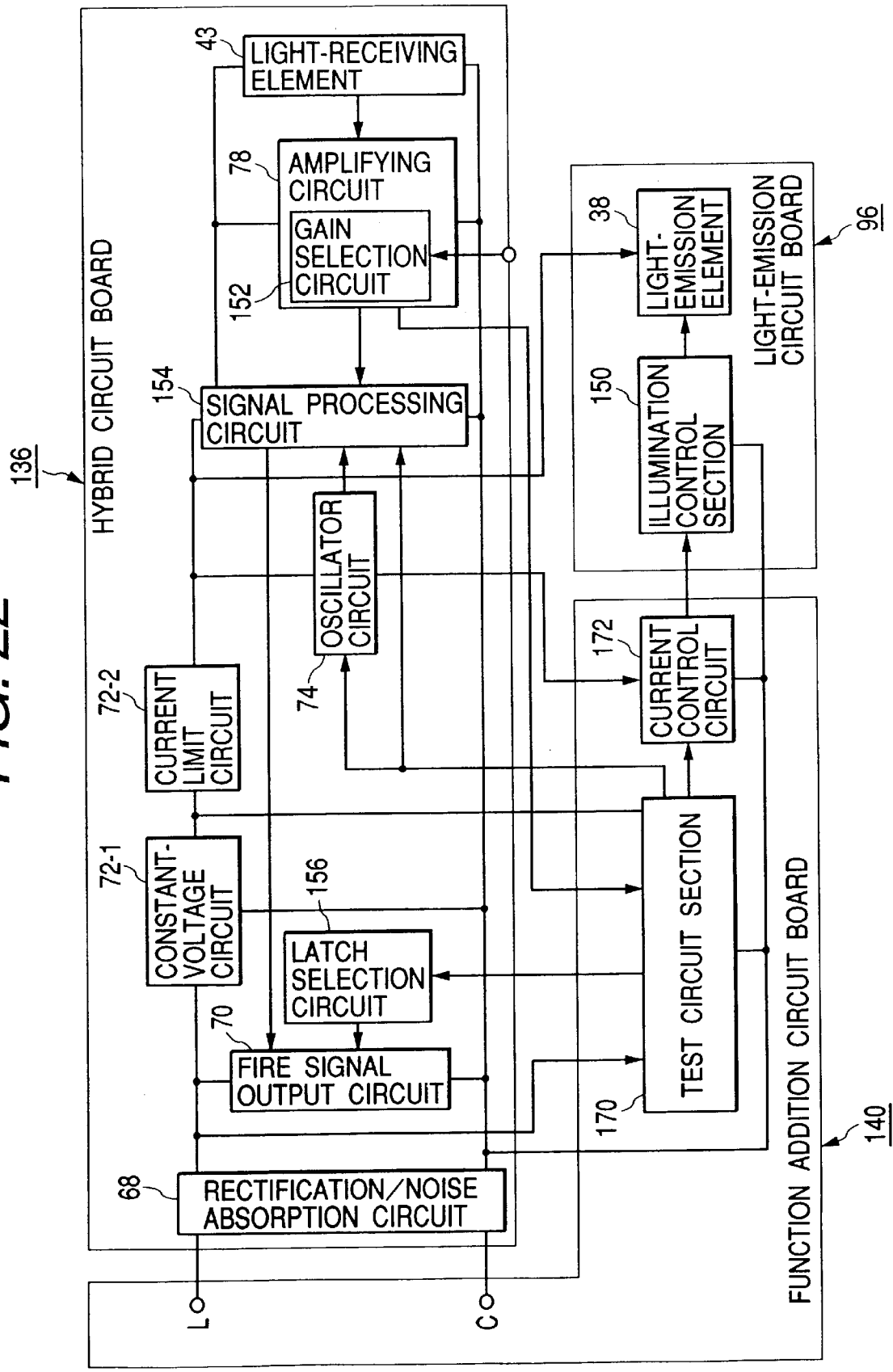
FIG. 22 is a block diagram showing a high-performance photoelectric smoke detector according to the present invention having an additional remote test function.

FIG. 22 is a block diagram of a high-performance photoelectric smoke detector according to the present invention which is additionally equipped with a type-P remote test function in the form of a circuit to be mounted on the function addition circuit board 140. In the block diagram, the hybrid circuit board 136 and the light-emission circuit board 96 are identical with those shown in FIG. 21.

In order to attain a type-P remote test function, a test circuit section 170 and a current control section 172 a remounted on the function addition circuit board 140. When the test circuit section 170 receives a test signal from external test equipment or a disaster-prevention monitor panel, the current control section 172 controls the illumination control section 150, to thereby increase the electric current to be sent to the light-emission element 38. An increase in the amount of emitted light due to an increase in the electric current leads to an increase in the amount of scattered light which enters the light-receiving element 43, thus performing a test operation.

When receiving a test signal, the test circuit section 170 brings the latch selection circuit 156 into a non-latch state, to thereby prevent latching of an output signal, which would otherwise be performed by the fire signal output circuit 70 in response to a test disaster warning. Upon receipt of a test signal, the test circuit section 170 shortens an interval between oscillation pulses of the oscillator circuit 74, so that the illumination control section 150 shortens an interval of light pulses emitted by the light-emission element 38. The test circuit section 170 cancels a counting operation of a counter provided in the signal processing circuit section 154. When a signal is output from the comparator in response to the amplified received-light signal output from the amplifying circuit 78, the fire signal output circuit 70 outputs a fire signal to the external test equipment and the disaster-prevention monitor panel over a period of time during which a fire signal exceeding a predetermined level is output as a result of a test operation, whereby the operator ascertains a result of the test.

The test circuit section 170 shown in FIG. 22 performs a test operation by means of increasing a light-emission current to be sent to the light-emission element 38. Alternatively, as shown in FIG. 21, a test operation may be performed by means of causing the test LED 146 to emit light.

Figure 23:
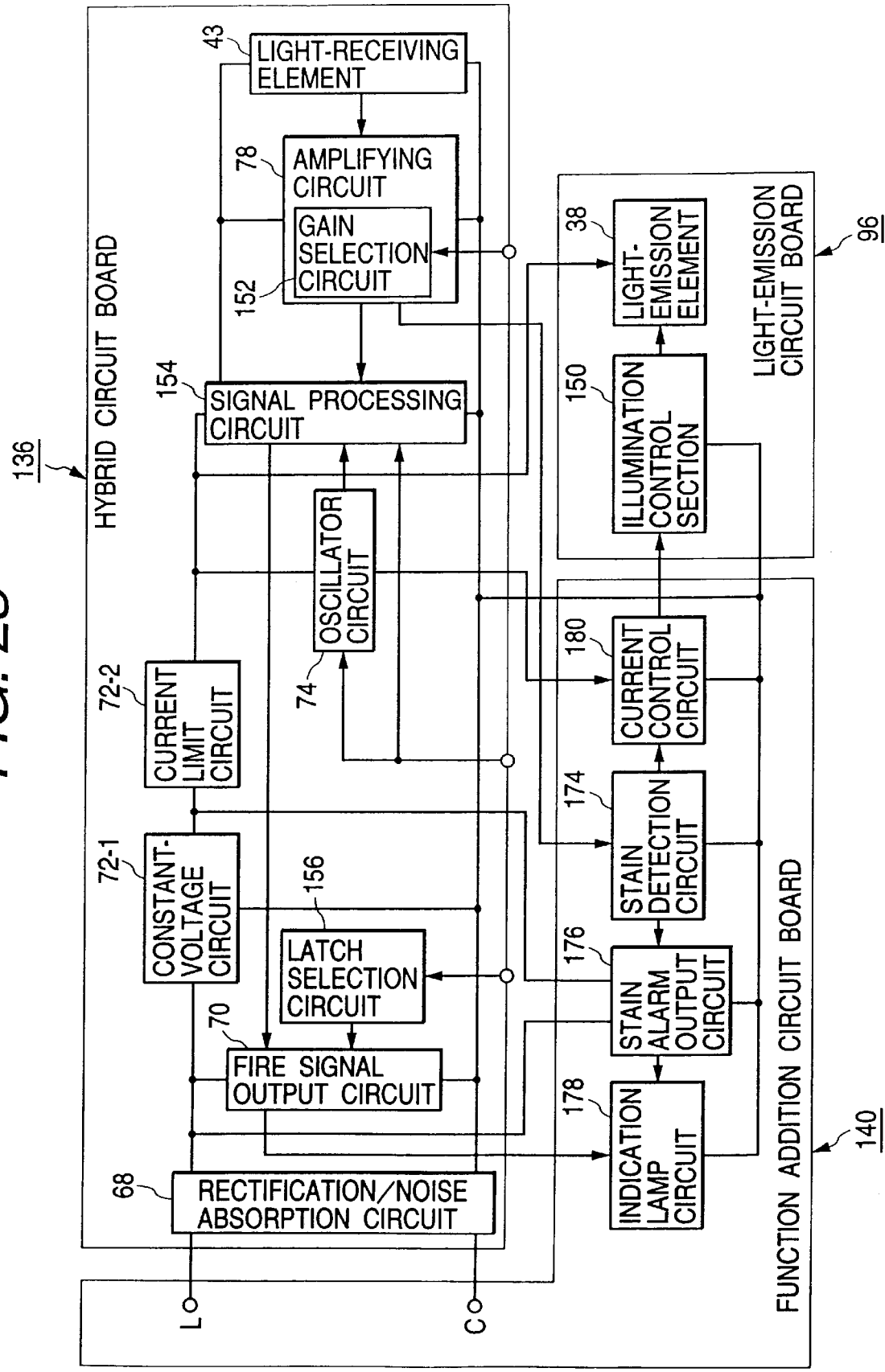
FIG. 23 is a block diagram showing a high-performance photoelectric smoke detector according to the present invention having an additional stain compensation function.
Figure 24:
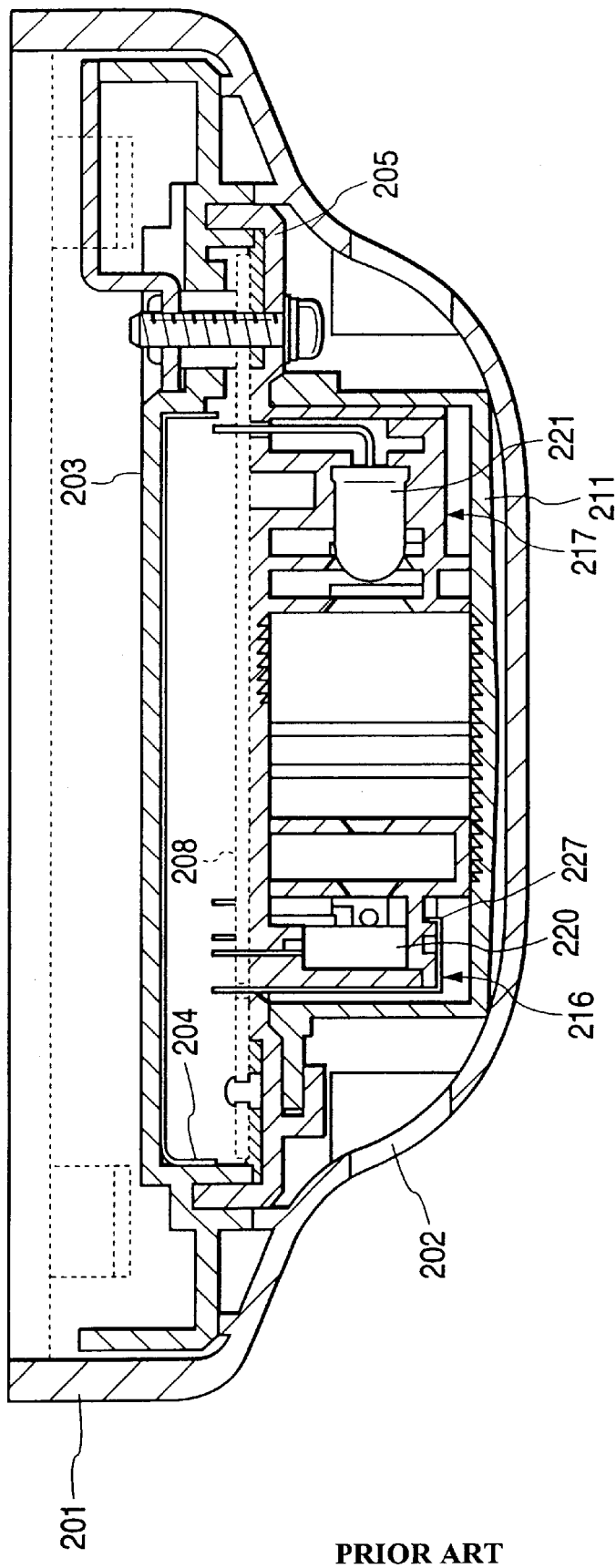
FIG. 24 is a cross-sectional view of a commonly-employed photoelectric smoke detector.
Figure 25:
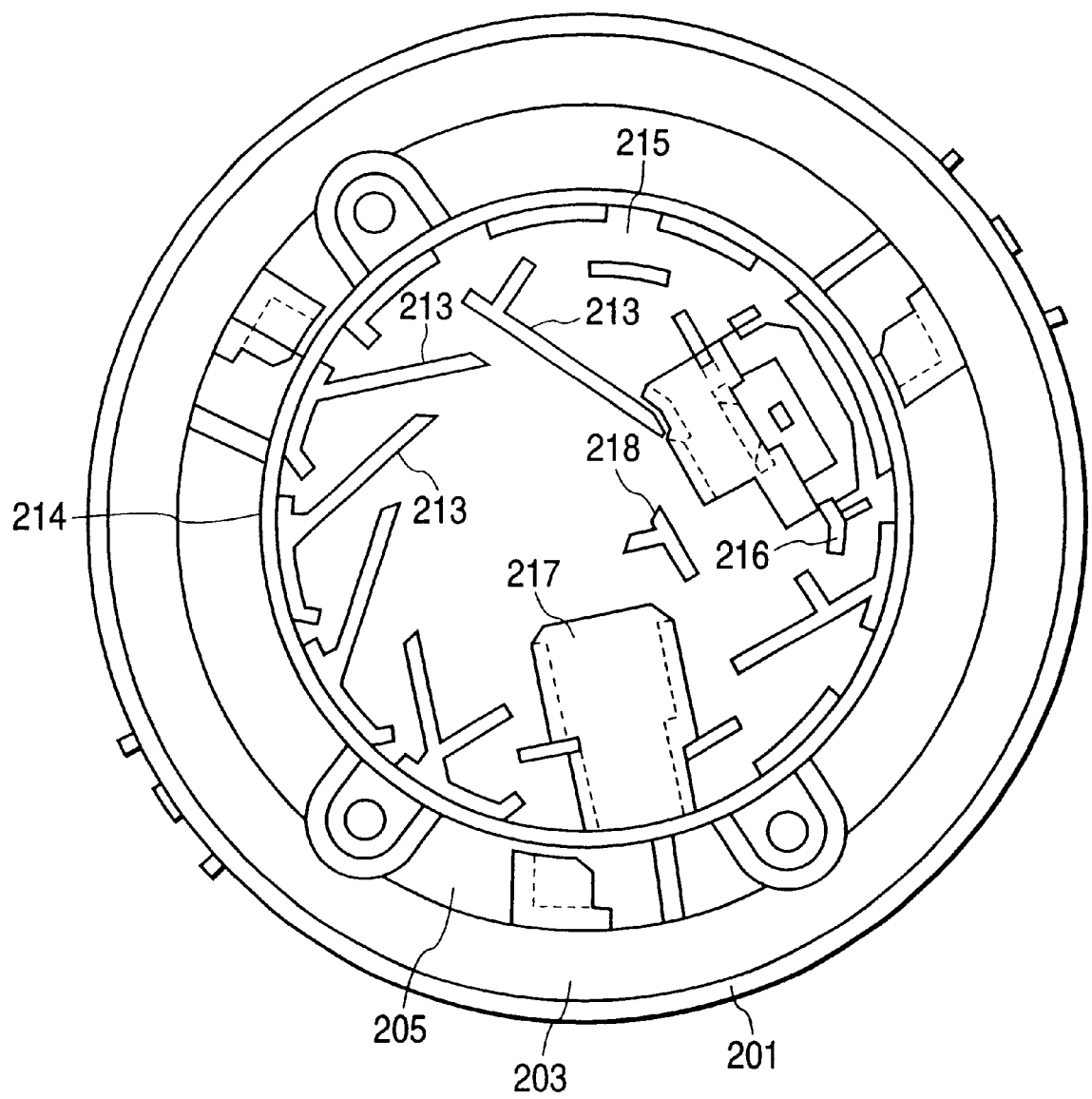
FIG. 25 is a plan view showing the interior structure of the commonly-employed photoelectric smoke detector shown in FIG. 24.
Figure 26:
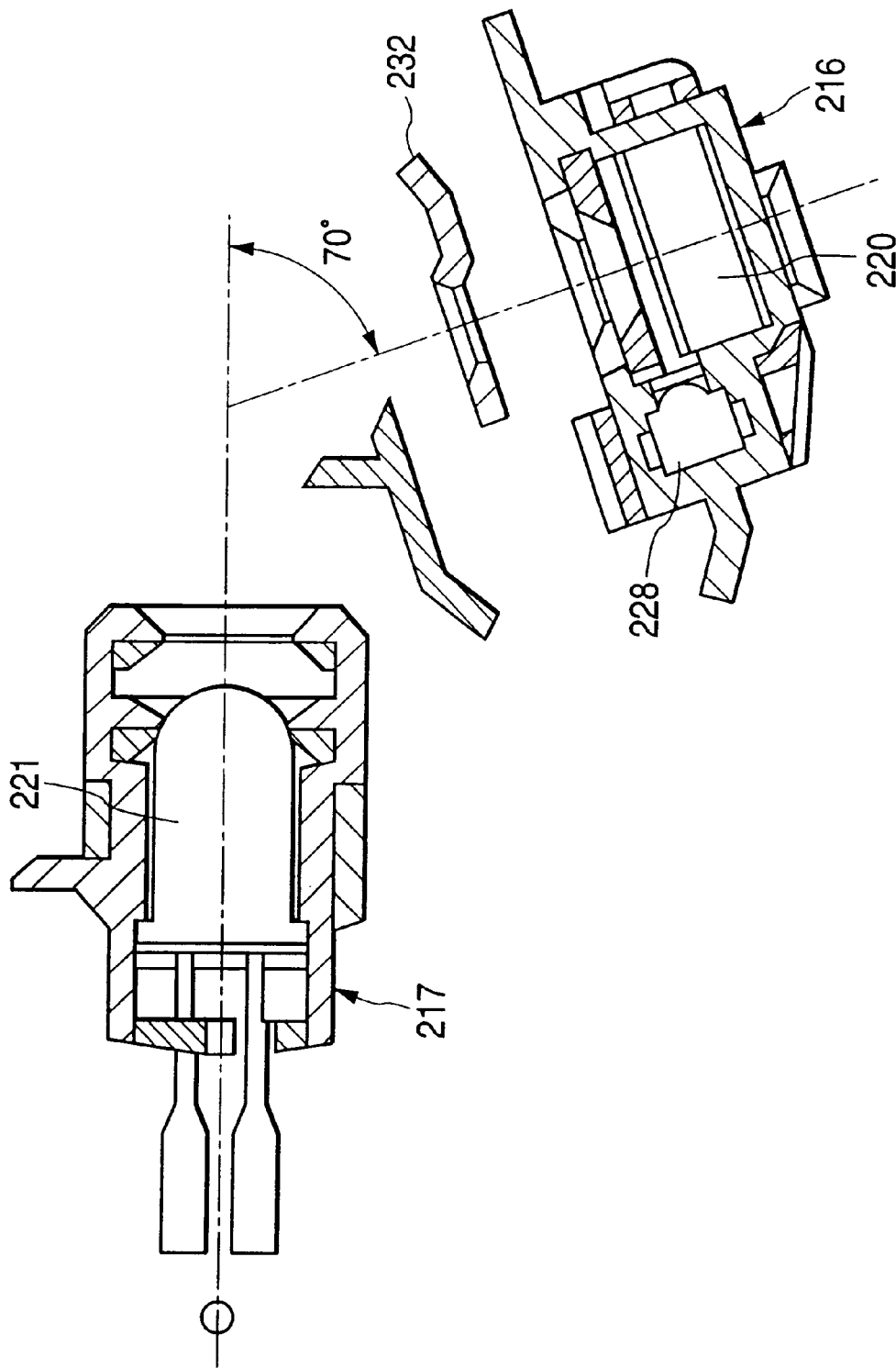
FIG. 26 is an illustration for describing the layout of a light emission section and a light receiving section of the smoke detector of scattered light type shown in FIG. 24.
Figure 27:
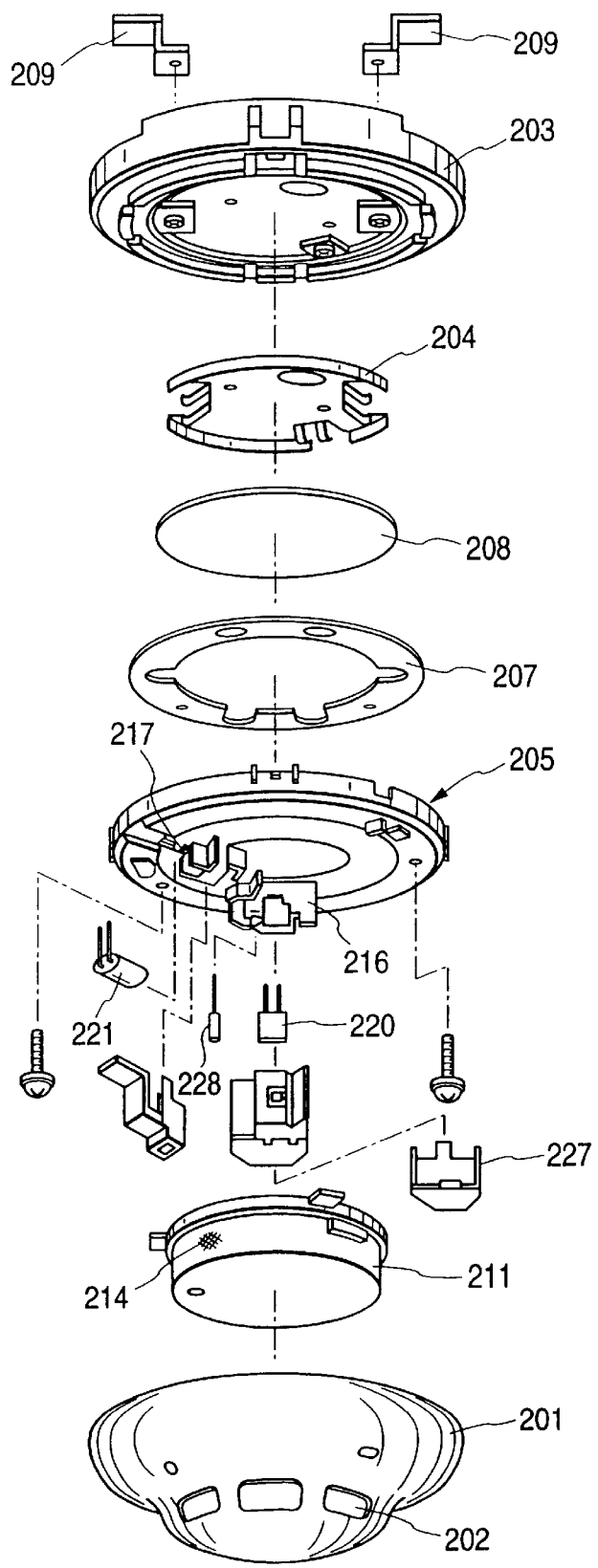
FIG. 27 is an exploded view of the commonly-employed smoke detector shown in FIG. 24.

FIG. 23 is a block diagram showing a high-performance photoelectric smoke detector according to the present invention to which a stain compensation function is added in the form of a circuit to be mounted on the function addition circuit board.

In the block diagram of the high-performance photoelectric smoke detector having such a stain compensation function, the hybrid circuit board 136 and the light-emission circuit board 96 are identical in configuration with those shown in FIG. 21. However, the function addition circuit board 140 is equipped with a stain detection circuit 174 for implementing a stain compensation function, a stain alarm output circuit 176, an indication lamp circuit 178, and a current control circuit 180.

The amplified received-light signal output from the amplifying circuit 78 is input to the stain detection circuit 174. A zero point is set for a case in which no smoke enters the smoke detector. The stain detection circuit 174 monitors whether or not the amplified received-light signal exceeds a predetermined range centered on the zero point. If the amplified signal exceeds a predetermined range centered on the zero point, the stain detection circuit 174 sends a stain detection signal to the stain alarm output circuit 176.

Upon receipt of the stain detection signal, the stain alarm output circuit 176 outputs an alarm output signal to the indication lamp circuit 178. Of two LEDs; that is, a red LED and a yellow LED, provided in the indication lamp, a yellow LED provided for non-fire purpose is caused to blink, thus emitting a stain alarm.

If the stain detection circuit 174 detects stain by means of the amplified received-light signal which exceeds a predetermined range centered on the zero point, the stain detection circuit 174 controls the current control circuit 180, thereby causing the illumination control section 150 of the light-emission circuit board 86 to increase a light-emission current to be applied to the light-emission element 38. An increase in the light-emission current compensates for a reduction or increase in the intensity of emitted light caused by stain.

The previous embodiments have described, as examples, the high-performance smoke detectors which are given an analog transmission function, a type-P remote test function, and a stain compensation function for attaining high performance, through use of a circuit to be mounted on the function addition circuit board 140. However, the present invention is not limited to these smoke detectors and covers an embodiment, in which a circuit section for attaining a high performance is mounted on the function addition circuit board 140, as required.

The previous embodiments have described, as an example, a configuration in which the hybrid circuit board 136 and the light-emission circuit board 96 are separately and fixedly mounted on the function addition circuit board 140 so as to face the smoke detecting chamber. As a matter of course, it may be the case that only the hybrid circuit board 136 is fixedly connected to the function addition circuit board 140 in the manner as mentioned in connection with the first embodiment, and the light-emission element 38 is mounted directly on the function addition circuit board 140.

The present invention is not limited to the previously-described embodiments and is susceptible to modifications without impairing the objective and advantages of the present invention. Further, the present invention is not limited by the numerical values described in connection with the embodiments.

As has been described, according to the present invention, the majority of electric components constituting electrical circuits of a photoelectric smoke detector are mounted on a hybrid circuit board housed in a light-receiving holder. Further, an amplifying circuit and a light-receiving element are integrated into a single piece, and hence substantially no lead wires are present between the light-receiving element and the amplifying circuit, thus preventing thorough influence of extraneous noise.

A rectification/noise absorption circuit and a light-emission circuit which are provided within a detector circuit and through which a comparatively large current flows are embodied as mounting discrete components to be mounted. Remaining circuits are formed as an integrated circuit. Thus, smoke detector assumes a hybrid configuration, and hence the number of components of an electrical circuit is significantly reduced. In association with such a reduction, the number of assembling steps is greatly reduced, thus curtailing costs.

Since the hybrid circuit board is housed within a light receiving section holder situated within a smoke detecting space, a space for housing a circuit board to be provided at an elevated position within the smoke detecting section becomes unnecessary, and the smoke detector can be greatly miniaturized correspondingly.

In addition to the basic circuit function of the photoelectric smoke detector, an analog transmission function, a type-P remote test function, or a stain compensation function is added to the smoke detector in the form of a circuit section to be mounted on the function addition circuit board, thereby realizing a high-performance photoelectric smoke detector. Even in this smoke detector, there can be attained prevention of intrusion of noise, which would otherwise arise by way of lead wires of a light-receiving element, a significant reduction in the number of components, and a significant reduction in the number of assembling steps. Moreover, a high-performance, compact, and low-profile photoelectric smoke detector can be embodied in substantially the same manner in which a non-high-performance basic photoelectric smoke detector is embodied.

What is claimed is:

1. A photoelectric smoke detector comprising:
    a light emission section holder having a light-emission element;
    a light receiving section holder having a light-receiving element, said light emission section holder and said light receiving section holder being disposed in a smoke detecting section defining a smoke detecting space;
    a hybrid circuit board which has an integrated circuit mounted thereon and is housed in the light receiving section holder, the integrated circuit including the light-receiving element and a received-light signal amplifying circuit, the hybrid circuit board being arranged so that the light-receiving surface of the light-receiving element is directed toward the smoke detecting space;
    wherein the light-receiving element receives light which has been emitted from the light-emission element and is scattered by smoke flowing in the smoke detecting space, thereby detecting occurrence of fire.

2. The photoelectric smoke detector according to claim 1, wherein the majority of electric circuit components of the detector including the integrated circuit are mounted on one surface of the hybrid circuit board; an opening is formed in an area on the hybrid circuit board on which the integrated circuit is to be mounted; and the integrated circuit is mounted on the hybrid circuit board so that the light-receiving surface of the light-receiving element is directed toward the remaining surface of the hybrid circuit board by way of the opening.

3. The photoelectric smoke detector according to claim 2, wherein a coating layer is laid on only the surface of the hybrid circuit board having the electric circuit components mounted thereon.

4. The photoelectric smoke detector according to claim 1, wherein a package of the integrated circuit is molded integrally with a condenser lens.

5. The photoelectric smoke detector according to claim 1, wherein a separate condenser lens is attached to a package of the integrated circuit.

6. The photoelectric smoke detector according to claim 1, wherein a pair of pieces of first lead metal fitting are connected at one end thereof to leads of the hybrid circuit board and are connected at the other end thereof to leads of the light-emission element, thus supporting the light-emission element, and a pair of pieces of second lead metal fitting to be used for establishing electrical connection with the outside are connected to remaining leads of the hybrid circuit board.

7. The photoelectric smoke detector according to claim 1, wherein leads of the hybrid circuit board are connected directly to leads of the light-emission element, thus supporting the light-emission element, and a pair of pieces of second lead metal-fittings to be used for establishing electrical connection with the outside are connected to remaining leads of the hybrid circuit board.

8. The photoelectric smoke detector according to claim 1, further comprising a light-emission circuit board which is separated from the hybrid circuit board and has mounted thereon electric circuit components constituting the light-emission element and a light-emission drive circuit and through which a comparatively large current flows;
   wherein a plurality of pieces of first lead metal fitting are connected at one end thereof to leads of the hybrid circuit board and are connected at the other end thereof to leads of the light-emission circuit board; and a pair of pieces of second lead metal fitting to be used for establishing electrical connection with the outside are connected to remaining leads of the hybrid circuit board.

9. The photoelectric smoke detector according to claim 8, wherein a current limit resistor is provided in the light-emission drive circuit, and the light-receiving sensitivity is adjusted by means of selecting the value of the current limit resistor.

10. The photoelectric smoke detector according to claim 8, wherein intermediate portions of the leads of the light-emission element connected to the light-emission circuit board are bent into a loop shape, and an offset of the optical axis is adjusted by means of mechanical bending of the leads.

11. The photoelectric smoke detector according to any one of claims 6 to 8, wherein a faceplate seal is affixed to the reverse side of the smoke detecting section in which the second lead metal fitting is disposed in an exposed state.

12. The photoelectric smoke detector according to claim 1, wherein the light-emission element is additionally mounted on the hybrid circuit board, and the hybrid circuit board has a light guide for guiding the light emitted from the light-emission element to the smoke detecting space.

13. The photoelectric smoke detector according to claim 1, wherein a wall element constituting a labyrinthine structure is provided upright on the smoke detection section main unit so as to become open toward the bottom side of the smoke detecting section.

14. The photoelectric smoke detector according to claim 13, wherein an insect screen is made of permeable raw material woven of fibers, and the insect screen is fixedly positioned so as to cover the surroundings and bottom of the smoke detecting section at the time of assembly of the smoke detector.

15. The photoelectric smoke detector according to claim 14, wherein the insect screen is fixedly sandwiched between the peripheral edge of the smoke detection section main unit and the interior of an exterior cover.

16. The photoelectric smoke detector according to claim 1, wherein, in addition to the light-receiving element and the amplifying circuit, the integrated circuit has a smoke detecting circuit and a light-emission oscillator circuit mounted thereon.

17. The photoelectric smoke detector according to claim 1, wherein, in addition to the light-receiving element and the amplifying circuit, the integrated circuit has mounted thereon a smoke detecting circuit, a light-emission oscillator circuit, a fire signal output circuit, and a power circuit.

18. The photoelectric smoke detector according to claim 16 or 17, wherein a first integrated circuit into which the light-receiving element and the amplifier circuit are integrated and a second integrated circuit into which remaining circuits are integrated are mounted on the hybrid circuit board.

19. The photoelectric smoke detector according to claim 1, wherein the photoelectric smoke detector is made up of five components, that is, the exterior cover, an insect screen, the smoke detection section main unit, a smoke detection section assembly having the hybrid circuit board, and a faceplate seal.

20. The photoelectric smoke detector according to claim 19, further comprising a low-profile mount base which is situated inside the exterior cover when fitted to the smoke detector, so that the mount base hides from the outside.

21. The photoelectric smoke detector according to claim 20, the low-profile mount base is a thin disk-shaped or polygonal member, and fitting sections are formed along the periphery of the mount base.

22. A smoke detection section assembly comprising:
   a light emission section holder having a light-emission element;
   a light receiving section holder having a light-receiving element;
   a hybrid circuit board which has an integrated circuit mounted thereon and is housed in the light receiving section holder, the integrated circuit including the light-receiving element and at least a received-light signal amplifying circuit, the hybrid circuit board being arranged so that the light-receiving surface of the light-receiving element is directed toward the smoke detecting space;
   wherein the light-receiving element receives light which has been emitted from the light-emission element and is scattered by smoke flowing in the smoke detecting space, thereby detecting occurrence of fire.

23. The smoke detection section assembly according to claim 22, wherein the majority of electric circuit components of the detector including the integrated circuit are mounted on one surface of the hybrid circuit board; an opening is formed in an area on the hybrid circuit board on which the integrated circuit is to be mounted; and the integrated circuit is mounted on the hybrid circuit board such that the light-receiving surface of the light-receiving element is directed toward the remaining surface of the hybrid circuit board by way of the opening.

24. The smoke detection section assembly according to claim 23, wherein a coating layer is laid on only the surface of the hybrid circuit board having the electric circuit components mounted thereon.

25. The smoke detection section assembly according to claim 22, wherein a package of the integrated circuit is molded integrally with a condenser lens.

26. The smoke detection section assembly according to claim 22, wherein a separate condenser lens is attached to a package of the integrated circuit.

27. The smoke detection section assembly according to claim 22, wherein a pair of pieces of first lead metal fitting are connected at one end thereof to leads of the hybrid circuit board and are connected at the other end thereof to leads of the light-emission element, thus supporting the light-emission element, and a pair of pieces of second lead metal fitting to be used for establishing electrical connection with the outside are connected to remaining leads of the hybrid circuit board.

28. The smoke detection section assembly according to claim 22, wherein leads of the hybrid circuit board are connected directly to leads of the light-emission element, thus supporting the light-emission element, and a pair of pieces of second lead metal fittings to be used for establishing electrical connection with the outside are connected to remaining leads of the hybrid circuit board.

29. The smoke detection section assembly according to claim 22, further comprising a light-emission circuit board which is separated from the hybrid circuit board and has mounted thereon electric circuit components constituting the light-emission element and a light-emission drive circuit and through which a comparatively large current flows; and wherein a plurality of pieces of first lead metal fitting are connected at one end thereof to leads of the hybrid circuit board and are connected at the other end thereof to leads of the light-emission circuit board; and a pair of pieces of second lead metal fitting to be used for establishing electrical connection with the outside are connected to remaining leads of the hybrid circuit board.

30. The smoke detection section assembly according to claim 29, wherein a current limit resistor is provided in the light-emission drive circuit, and the light-receiving sensitivity is adjusted by means of selecting the value of the current limit resistor.

31. The smoke detection section assembly according to claim 29, wherein intermediate portions of the leads of the light-emission element connected to the light-emission circuit board are bent into a loop shape, and an offset of the optical axis is adjusted by means of mechanical bending of the leads.

32. The smoke detection section assembly according to claim 22, wherein the light-emission element is additionally mounted on the hybrid circuit board, and the hybrid circuit board has a light guide for guiding the light emitted from the light-emission element to the smoke detecting space.

33. The smoke detection section assembly according to claim 22, wherein, in addition to the light-receiving element and the amplifying circuit, the integrated circuit has a smoke detecting circuit and a light-emission oscillator circuit mounted thereon.

34. The smoke detection section assembly according to claim 22, wherein, in addition to the light-receiving element and the amplifying circuit, the integrated circuit has mounted thereon a smoke detecting circuit, a light-emission oscillator circuit, a fire signal output circuit, and a power circuit.

35. The smoke detection section assembly according to claim 33 or 34, wherein a first integrated circuit into which the light-receiving element and the amplifier circuit are integrated and a second integrated circuit into which remaining circuits are integrated are mounted on the hybrid circuit board.

36. The photoelectric smoke detector according to claim 1, wherein a function addition circuit board which is separated from the hybrid circuit board and has mounted thereon electric circuit components constituting a function addition circuit for attaining a high-performance detector is fixedly connected to the hybrid circuit board, and the function addition circuit board is housed in a circuit housing section defined in a position above the smoke detecting space.

37. The photoelectric smoke detector according to claim 36, further comprising a light-emission circuit board which is separated from the hybrid circuit board and has mounted thereon electric circuit components constituting the light-emission element and a light-emission drive circuit and through which a comparatively large current flows; and wherein the light-emission circuit board and the hybrid circuit board are fixedly connected to the function addition circuit board.

38. The photoelectric smoke detector according to claim 37, wherein a pair of pieces of lead metal fitting to be used for establishing electrical connection with the outside are connected to leads of the function addition circuit board.

39. The photoelectric smoke detector according to claim 36, wherein, in a case where there is constituted an analog detector additionally provided with an analog transmission function, at least a transmission circuit, an address setting circuit, a control circuit, and a test light-emission element are mounted on the function addition circuit board.

40. The photoelectric smoke detector according to claim 36, wherein, in a case where there is constituted a detector additionally provided with a remote test function, the function addition circuit board is equipped with a test circuit which performs a test operation upon detection of a test signal addressed to the test circuit and sends a test output signal.

41. The photo electric smoke detector according to claim 36, wherein, in a case where there is constituted a detector additionally provided with a stained state display function, the function addition circuit board has mounted thereon at least a stain detection circuit which monitors whether or not a zero point level of an amplified received-light output falls within a predetermined sensitivity range and produces an output when the zero point level falls outside the predetermined sensitivity range, a stain alarm output circuit which outputs a stain alarm upon receipt of an output from the stain detection circuit, and an indication lamp circuit which, upon receipt of the stain alarm output, indicates that the zero point level of the amplified received-light output is outside the sensitivity range.

42. The photoelectric smoke detector according to claim 41, further comprising a current control circuit for controlling the amount of light emitted by the light-emission element, and the stain detection circuit increases or decreases the amount of emission light by means of controlling the current control circuit in accordance with a detected stained state, thereby compensating for a decrease or increase in the amount of light caused by stain.

43. The photoelectric smoke detector according to claim 36, wherein electric circuit components are mounted on the function addition circuit board so as to face the smoke detecting space.

44. The photoelectric smoke detector according to any one of claims 39 to 42, wherein, in association with electric circuit components being mounted on the function addition circuit board, operations of unrequired circuit section mounted on the hybrid circuit board are inhibited.

* * * * *